United States Patent
Kim et al.

(10) Patent No.: US 11,513,222 B2
(45) Date of Patent: Nov. 29, 2022

(54) IMAGE SENSORS FOR MEASURING DISTANCE INCLUDING DELAY CIRCUITS FOR TRANSMITTING SEPARATE DELAY CLOCK SIGNALS

(71) Applicant: Samsung Electronics Co., Ltd., Suwon-si (KR)

(72) Inventors: Dae-yun Kim, Asan-si (KR); Myung-han Bae, Hwaseong-si (KR); Min-sun Keel, Seoul (KR); Yeo-myung Kim, Seoul (KR); Hyun-surk Ryu, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 553 days.

(21) Appl. No.: 16/540,508

(22) Filed: Aug. 14, 2019

(65) Prior Publication Data

US 2020/0256991 A1   Aug. 13, 2020

(30) Foreign Application Priority Data

Feb. 12, 2019  (KR) ........................ 10-2019-0016358

(51) Int. Cl.
*G01S 17/08* (2006.01)
*G01S 7/4863* (2020.01)
(Continued)

(52) U.S. Cl.
CPC ............ *G01S 17/08* (2013.01); *G01S 7/4863* (2013.01); *G01S 7/4915* (2013.01); *G01S 17/89* (2013.01);
(Continued)

(58) Field of Classification Search
CPC ...... G01S 17/08; G01S 7/4863; G01S 7/4915; G01S 17/894; G01S 17/89; G01S 17/36;
(Continued)

(56) References Cited

U.S. PATENT DOCUMENTS 8,953,152 B2   2/2015  Min et al.
9,081,095 B2   7/2015  Suzuki et al.
(Continued)

FOREIGN PATENT DOCUMENTS

EP   2842751 A2 *  3/2015  .......... B41J 2/04573
KR   20110044862 A *  5/2011  ....... H01L 27/14603
KR   101848771 B1 *  5/2018  ....... H01L 27/14656

*Primary Examiner* — Jennifer D Bennett
*Assistant Examiner* — Erin R Garber
(74) *Attorney, Agent, or Firm* — Harness, Dickey & Pierce, P.L.C.

(57) ABSTRACT

An image sensor includes a plurality of pixels and photo gate controller circuitry. Each pixel may transmit a pixel signal, corresponding to a photoelectric signal, in response to a photo gate signal in a frame. The photo gate controller circuitry may generate photo gate signals and transmit photo gate signals to the pixels. The photo gate controller circuitry includes a first delay circuit configured to transmit first delay clock signals each being delayed with respect to a reference clock signal by a certain amount of time and a second delay circuit configured to transmit second delay clock signals each being delayed with respect to the reference clock signal by a certain amount of time. The pixels are each configured to selectively receive signals, as the photo gate signals, among the delay clock signals output from the first delay circuit and the delay clock signals output from the second delay circuit.

20 Claims, 20 Drawing Sheets

(51) Int. Cl.
  *H04N 5/376*      (2011.01)
  *H01L 27/146*     (2006.01)
  *G01S 7/4915*     (2020.01)
  *G01S 17/89*      (2020.01)
  *H01L 31/02*      (2006.01)
  *G01S 17/894*     (2020.01)
  *H04N 5/369*      (2011.01)
  *H04N 5/357*      (2011.01)
  *H04N 5/378*      (2011.01)

(52) U.S. Cl.
  CPC .. *H01L 27/14603* (2013.01); *H01L 27/14643* (2013.01); *H04N 5/3765* (2013.01); *G01S 17/894* (2020.01); *H01L 31/02016* (2013.01); *H04N 5/357* (2013.01); *H04N 5/369* (2013.01); *H04N 5/378* (2013.01)

(58) Field of Classification Search
  CPC .... G01S 7/4865; G01S 7/4914; G01S 7/4861; H01L 27/14603; H01L 27/14643; H01L 31/02016; H01L 5/369; H04N 5/357; H04N 5/378; H04N 5/3765; H04N 5/232122
  See application file for complete search history.

(56) References Cited

U.S. PATENT DOCUMENTS

| | | | |
|---|---|---|---|
| 2008/0111720 A1* | 5/2008 | Huang | G04F 10/005 |
| | | | 341/53 |
| 2011/0164132 A1 | 7/2011 | Buettgen et al. | |
| 2011/0205522 A1 | 8/2011 | Snow et al. | |
| 2014/0111617 A1 | 4/2014 | Livshitz | |
| 2014/0240492 A1 | 8/2014 | Lee | |
| 2016/0290790 A1 | 10/2016 | Wu | |
| 2016/0337607 A1* | 11/2016 | Okamoto | H01L 27/1225 |
| 2017/0184722 A1 | 6/2017 | Park et al. | |
| 2018/0011195 A1 | 1/2018 | Perry et al. | |

* cited by examiner

IMAGE SENSORS FOR MEASURING DISTANCE INCLUDING DELAY CIRCUITS FOR TRANSMITTING SEPARATE DELAY CLOCK SIGNALS

CROSS-REFERENCE TO RELATED APPLICATION

This application is based on and claims priority under 35 U.S.C. § 119 to Korean Patent Application No. 10-2019-0016358, filed on Feb. 12, 2019, in the Korean Intellectual Property Office, the disclosure of which is incorporated herein in its entirety.

BACKGROUND

The inventive concepts relate to image sensors, and more particularly, to image sensors for measuring distance.

Time-of-flight (ToF) based image sensors generate one or more three-dimensional (3D) images of an object by processing information indicating a distance from the ToF-based image sensors to the object, such that ToF-based image sensors generate one or more 3D images of the object based on processing the information to measure the distance to the object. Such information may be referred to herein as information about the distance to the object, information associated with the distance to the object, or the like. ToF-based image sensors obtain information about the distance to the object by irradiating a light beam on the object (e.g., emitting a light beam towards the object such that at least a portion of the object is irradiated by the light beam) and measuring flight time of the light beam until the light beam reflected from the object is received (e.g., a time between emission of the light beam from the ToF-based image sensors toward the object and receipt of a reflection of the light beam from a surface of the object at the ToF-based image sensors).

SUMMARY

The inventive concepts provide image sensors for measuring distance to reduce reading noise associated with information about a distance to an object that is generated at ToF-based image devices, where the information may include depth information associated with the object, where the information includes the reading noise due to various cases, to therefore enable the ToF-based image sensors to determine the distance to the object determined, based on processing the information, with improved accuracy based on reduction of the reading noise in the information.

According to some example embodiments of the inventive concepts, an image sensor may include a plurality of pixels and photo gate controller circuitry. Each pixel of the plurality of pixels may be configured to transmit a pixel signal in response to a photo gate signal received at the pixel in a frame. The pixel signal may correspond to a photoelectric signal generated at a photodiode of the pixel. The photo gate controller circuitry may be configured to generate a plurality of photo gate signals and transmit the plurality of photo gate signals to separate, respective sets of one or more pixels of the plurality of pixels. The photo gate controller circuitry may include a first delay circuit configured to transmit first delay clock signals such that each first delay clock signal of the first delay clock signals is delayed with respect to a reference clock signal by a separate, respective particular amount of time, and a second delay circuit configured to transmit second delay clock signals such that each second delay clock signal of the second delay clock signals is delayed with respect to the reference clock signal by a separate, respective particular amount of time. Each pixel of the plurality of pixels may be configured to selectively receive, as the photo gate signal received at the pixel in the frame, one signal among the first delay clock signals and the second delay clock signals.

According to some example embodiments of the inventive concepts, an image sensor may include a plurality of pixels and photo gate controller circuitry. Each pixel of the plurality of pixels may be configured to transmit a pixel signal in response to a photo gate signal received at the pixel in a frame. The pixel signal may correspond to a photoelectric signal generated at a photodiode of the pixel. The photo gate controller circuitry may be configured to generate a plurality of photo gate signals and transmit the plurality of photo gate signals to separate, respective sets of one or more pixels of the plurality of pixels. The photo gate controller circuitry may include a first delay circuit configured to transmit a first delay clock signal and a second delay clock signal, each delay clock signal of the first and second delay clock signals transmitted by the first delay circuit being delayed with respect to a reference clock signal by a separate, respective particular amount of time, a second delay circuit configured to output a first delay clock signal and a second delay clock signal, each delay clock signal of the first and second delay clock signals transmitted by the second delay circuit being delayed with respect to the reference clock signal by a separate, respective amount of time, a first selector configured to transmit, as one photo gate signal of the plurality of photo gate signals, a first selection clock signal selected between the first delay clock signal transmitted by the first delay circuit and the first delay clock signal transmitted by the second delay circuit, and a second selector configured to transmit, as a separate photo gate signal of the plurality of photo gate signals, a second selection clock signal selected between the second delay clock signal transmitted by the first delay circuit and the second delay clock signal transmitted by the second delay circuit. The second delay clock signal transmitted by the first delay circuit may have a longer delay time than the first delay clock signal transmitted by the first delay circuit, and the second delay clock signal transmitted by the second delay circuit has a shorter delay time than the first delay clock signal transmitted by the second delay circuit.

According to some example embodiments of the inventive concepts, an image sensor may include a plurality of pixels, photo gate controller circuitry, and a read out circuit. Each pixel of the plurality of pixels may be configured to transmit a pixel signal in response to a photo gate signal received at the pixel. The pixel signal may correspond to a photoelectric signal generated at a photodiode of the pixel. The photo gate controller circuitry may be configured to transmit photo gate signals to separate, respective sets of one or more pixels of the plurality of pixels, subsequently to generating the photo gate signals. The read out circuit may be configured to obtain depth information associated with an object based on some or all of the pixel signals transmitted by separate, respective pixels of the plurality of pixels. The photo gate controller circuitry may include a first delay circuit configured to transmit a first delay clock signal delayed by a particular amount of time with respect to a reference clock signal as the photo gate signal, and a second delay circuit configured to transmit a second delay clock signal delayed by a particular amount of time with respect to the reference clock signal as the photo gate signal. The read out circuit may be configured to obtain the depth information based on interpolating a first pixel signal transmitted by the some or all pixels in response to the first delay clock signal and a second pixel signal transmitted by the some or all pixels in response to the second delay clock signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
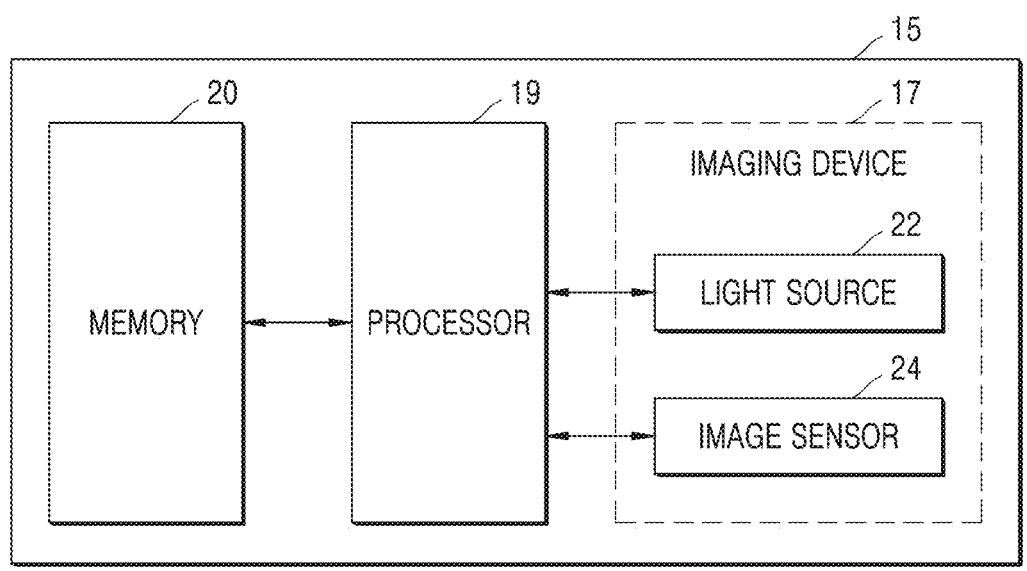
FIG. 1 is a schematic block diagram of a system according to some example embodiments.

FIG. 1 is a schematic block diagram of a system 15 according to some example embodiments.

Referring to FIG. 1, the system 15 may include an imaging device 17 which communicates with and is connected to a processor 19 or a host. The system 15 may further include a memory 20 which is connected to the processor 19 for storing information such as image data received from the imaging device 17. In some example embodiments, the system 15 may be integrated into one semiconductor chip. In some example embodiments, the imaging device 17, the processor 19, and the memory 20 each may be implemented as a separate individual semiconductor chip. In some example embodiments, the memory 20 may include one or more memory chips. In some example embodiments, the processor 19 may include multi-processing chips.

The system 15 may include a low power electronic device for application of an image sensor for distance measurement, according to some example embodiments. The system 15 may be portable or stationary. Examples of portable forms of the system 15 may include a mobile device, a mobile phone, a smart phone, user equipment (UE), a tablet, a digital camera, a laptop or desktop computer, an electronic smart watch, a machine-to-machine (M2M) communication device, a virtual reality (VR) device or module, a robot, etc. Examples of fixed forms of the system 15 may include a game console of a video game room, a reciprocal video terminal, an automobile, a machine vision system, an industrial robot, a virtual reality (VR) device, a camera embedded on driver's side in an automobile, etc.

In some example embodiments, the imaging device 17 may include a light source 22 and an image sensor 24. The light source 22 may include, for example, a laser diode (LD) or a light-emitting diode (LED) for emitting infrared (IR) rays or visible light, a near IR (NIR) ray laser, a point light source, a monochromatic light source combined with a white lamp and a monochromator, or a combination of other laser light sources. In some example embodiments, the light source 22 may emit IR light having a wavelength of about 800 nm to about 1000 nm. The image sensor 24 may include a pixel array and auxiliary processing circuits.

In some example embodiments, the processor 19, which may also be referred to herein as "processing circuitry," may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc . . . In some example embodiments, the processor 19 may include one or more CPUs which operate in a distributed processing environment. In some example embodiments, the processor 19 may include a system on chip (SoC) with functions in addition to functions of the CPU.

The memory 20, which may also be referred to herein as "memory circuitry," a "storage device," or the like, may include, for example, dynamic random-access memory (RAM) (DRAM) such as synchronous DRAM (SDRAM), and a DRAM-based three-dimensional (3D) stack (3DS) memory such as a high bandwidth memory (HBM) memory or a hybrid memory cube (HMC) memory. The memory 20 may include a semiconductor-based storage such as solid state drive (SSD), a DRAM module, static RAM (SRAM), phase-change RAM (PRAM), resistive RAM (RRAM), conductive-bridging RAM (CBRAM), magnetic RAM (MRAM), and spin-transfer torque MRAM (STT-MRAM).

Figure 2:
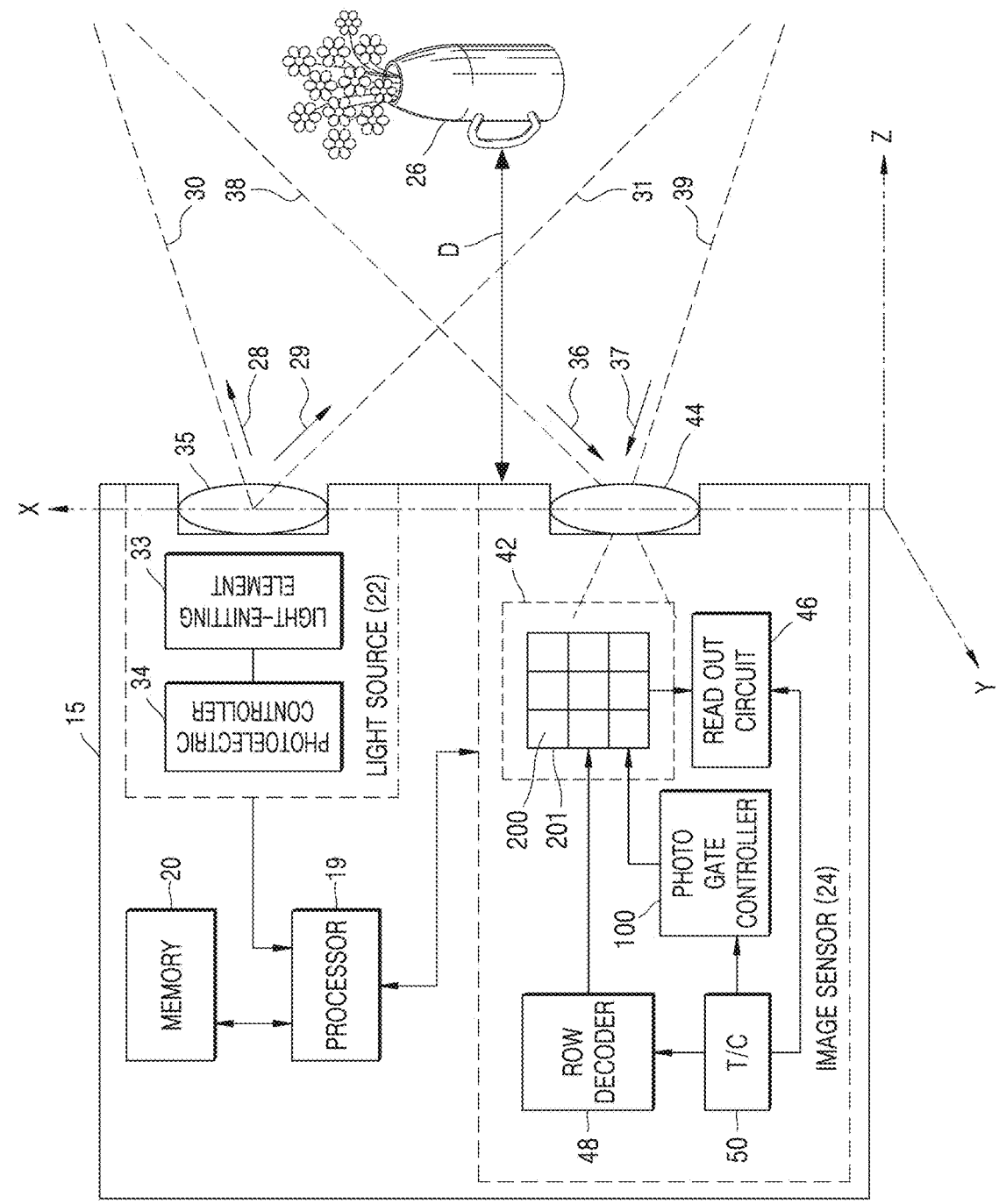
FIG. 2 is a block diagram for explaining an example operation of the system, according to some example embodiments.

FIG. 2 is a block diagram for explaining an example operation of the system 15, according to some example embodiments.

Referring to FIG. 2, the system 15 may be used to obtain depth information about ("associated with") an object, or distance information in a Z-axis about ("associated with") a 3D object 26 which is an individual object or an object in a scene. In some example embodiments, the depth information may be computed by the processor 19 based on scan data received from the image sensor 24, or may be computed autonomously by the image sensor 24. In some example embodiments, the depth information may be used as a part of a 3D user interface by the processor 19, and may allow a user of the system 15 to interact with a 3D image of the 3D object 26 as a part of other applications executed in a game or in the system 15, or to use the 3D image of the 3D object 26.

An X-axis may be a horizontal direction along a front side of the system 15, a Y-axis may be a vertical direction away from a page, and the Z-axis may extend from the system 15 in the direction of the object 26 to be imaged. Optical axes of the light source 22 and the image sensor 24 may be parallel to the Z-axis for depth measurement.

The light source 22 may irradiate transmitted light beams (28 and 29) on the 3D object 26 as illustrated by arrows. The transmitted light beams (28 and 29) may be emitted along light beam irradiation paths (30 and 31).

A projection lens 35 may include a cylindrical optical element that concentrates the transmitted light beams (28 and 29) from a light-emitting element 33 at a point on a surface of the object 26. For example, the projection lens 35 may include a concentration lens having a convex structure therein, but is not limited thereto, and another type of a suitable lens design may be selected for the projection lens 35.

In some example embodiments, the light-emitting element 33 may include, for example, an LD or an LED configured to emit IR rays or visible light, an NIR ray laser, a point light source, a monochromatic light source combined with a white lamp and a monochromator, or a combination of other laser light sources. The light-emitting element 33 may be fixed at one position inside a housing of the system 15, and may be rotatable in the X- and Y-axes directions. The light-emitting element 33 may be controlled in the X- and Y-axes directions by a light controller 34, and may perform a point scan of the 3D object 26. The light controller 34, which may also be referred to herein as "light controller circuitry," may include processing circuitry such as hardware including logic circuits; a hardware/software combination such as a processor executing software; or a combination thereof. For example, the light controller 34 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Reflected light beams (36 and 37) reflected by the 3D object 26 may travel along light beam concentration paths (38 and 39). As the reflected light beams (36 and 37) are received along the light beam concentration paths (38 and 39), photons which are scattered by or reflected from the surface of the 3D object 26 may move. In FIG. 2, various paths illustrated by arrows and dashed lines may be examples. However, paths along which actual photoelectric signals move are not limited to paths illustrated in FIG. 2.

The reflected light beams (36 and 37) received from the irradiated 3D object 26 may be integrated on a pixel array 42 through a collection lens 44 of the image sensor 24. Similar to the projection lens 35, the collection lens 44 may include a collecting lens or another cylindrical optical element on a glass surface or a plastic surface for integrating the reflected light beams (36 and 37) received from the 3D object 26 onto the pixel array 42. In some example embodiments, the collection lens 44 may be a collection lens having a convex structure, but is not limited thereto.

The image sensor 24 may obtain the depth information that is the distance information about the 3D object 26, which may be information that indicates a distance "D" from the system 15 to the 3D object 26, also referred to as "depth of the 3D object," by using time-of-flight (ToF). Phase difference of the reflected light beams (36 and 37) with respect to the transmitted light beams (28 and 29) may correspond to the ToF. The image sensor 24 may obtain the depth information about the 3D object 26 by calculating the phase difference.

The pixel array 42 may include a plurality 201 of pixels 200. A structure of each pixel 200 of the plurality 201 of pixels 200 is described in detail with reference to FIG. 3. In some example embodiments, each pixel 200 of the plurality 201 of pixels 200 may be a depth sensor pixel operating in a TOF manner. The 3×3 pixel array 42 is illustrated in FIG. 2 for convenience of description, but the number ("quantity") of pixels 200 included in the pixel array 42 may vary.

The pixel array 42 may include a red-green-blue (RGB) pixel array in which different pixels 200 collect different colors of light. The pixel array 42 may include, for example, a two-dimensional (2D) RGB sensor with an IR cutoff filter, a 2D IR sensor, a 2D NIR sensor, a 2D RGB white (W) (RGBW) sensor, a 2D RGB-IR sensor, etc. The system 15 may use the identical pixel array 42 not only for 3D imaging (including the depth measurement) but also for imaging 2D RGB color (or a scene containing an object) of the object 26.

The pixel array 42 may convert the received reflected light beams (36 and 37) into corresponding electrical signals, that is, pixel signals, and the pixel signals may be processed by a read out circuit 46 to obtain depth information associated with the object 26 based on some or all of the pixel signals transmitted by separate, respective pixels 200 of the plurality 201 of pixels 200 and to thereby determine a 3D depth image of the object 26. Restated, the pixel array 42 may generate pixel signals based on receiving the reflected light beams (36 and 37). Restated, the pixel array 42 may transmit pixel signals based on receiving the reflected light beams (36 and 37). The read out circuit 46 may generate image data based on the pixel signals output from the pixel array 42. For example, the read out circuit 46 may include an analog-to-digital converter for performing an analog-to-digital conversion on the pixel signals, and may include an image signal processor (ISP) which processes digital pixel signals, into which the pixel signals have been converted, and calculates distance information (or the depth information). In some example embodiments, the ISP may be separately arranged outside the image sensor 24.

A pixel signal generated by a pixel 200 may correspond to a photoelectric signal.

A timing controller (T/C) 50 may control components of the image sensor 24 (for example, the read out circuit 46, a photo gate controller 100, and/or a row decoder 48). The photo gate controller 100 may, according to the control of the T/C 50, generate control signals and transmit the control signals to the pixel array 42. The control signal may be a signal for controlling each of the transistors included in each of the pixels 200. The control signals are described in detail with reference to FIG. 3 and the like.

The photo gate controller 100, also referred to herein as photo gate controller circuitry, may generate clock signals for controlling transmission transistors included in each of the pixels 200. The photo gate controller 100 may include a reference clock signal generator generating a reference clock signal, a first delay circuit and a second delay circuit which receive the reference clock signal and respectively output delay clock signals delayed by a certain time (the delay time). The photo gate controller 100 may select one delay clock signal among the delay clock signal output from the first delay circuit and the delay clock signal output from the second delay circuit, and transmit the selected one delay clock signal to the transmission transistor of the pixel array 42.

The image sensor 24 according to the inventive concepts may include the first delay circuit and the second delay circuit to selectively provide the pixel array 42 with one of two different delay clock signals that are respectively output from the first and second delay circuits. Noise of the distance information that is generated due to differences in the delay times of the clock signals provided to the transmission transistors of each of the pixels 200 may be decreased. A configuration of the photo gate controller 100 is described in detail with reference to FIG. 4A and the like.

The row decoder 48 may decode a plurality of row control signals output from the timing controller 50, and according to a result of the decoding, may drive the plurality 201 of pixels 200 included in the pixel array 42 in row units. The row decoder 48 may include a concept including a row driver.

The processor 19 may control operations of the light source 22 and the image sensor 24. For example, the system 15 may be controlled by a user, and may include a mode switch for switching the 2D imaging mode and the 3D imaging mode. When the user selects the 2D imaging mode by using the mode switch, the processor 19 may activate the image sensor 24, and since the 2D imaging mode uses ambient light, the processor 19 may not activate the light source 22. In some example embodiments, the processor 19 may control operations of the light source 22 and the image sensor 24 based on executing one or more programs of instructions stored at memory 20.

When the user selects the 3D imaging mode by using the mode switch, the processor 19 may activate both the light source 22 and the image sensor 24. The processed image data received from the read out circuit 46 may be stored in the memory 20 by the processor 19. The processor 19 may display a 2D or 3D image selected by the user on a display screen of the system 15. The processor 19 may be programmed with software or firmware to perform various processing tasks. In some example embodiments, the processor 19 may include programmable hardware logic circuits for performing some or all of the functions described above. For example, the memory 20 may store program codes, look-up tables, or intermediate operation results such that the processor 19 performs corresponding functions.

Figure 3:
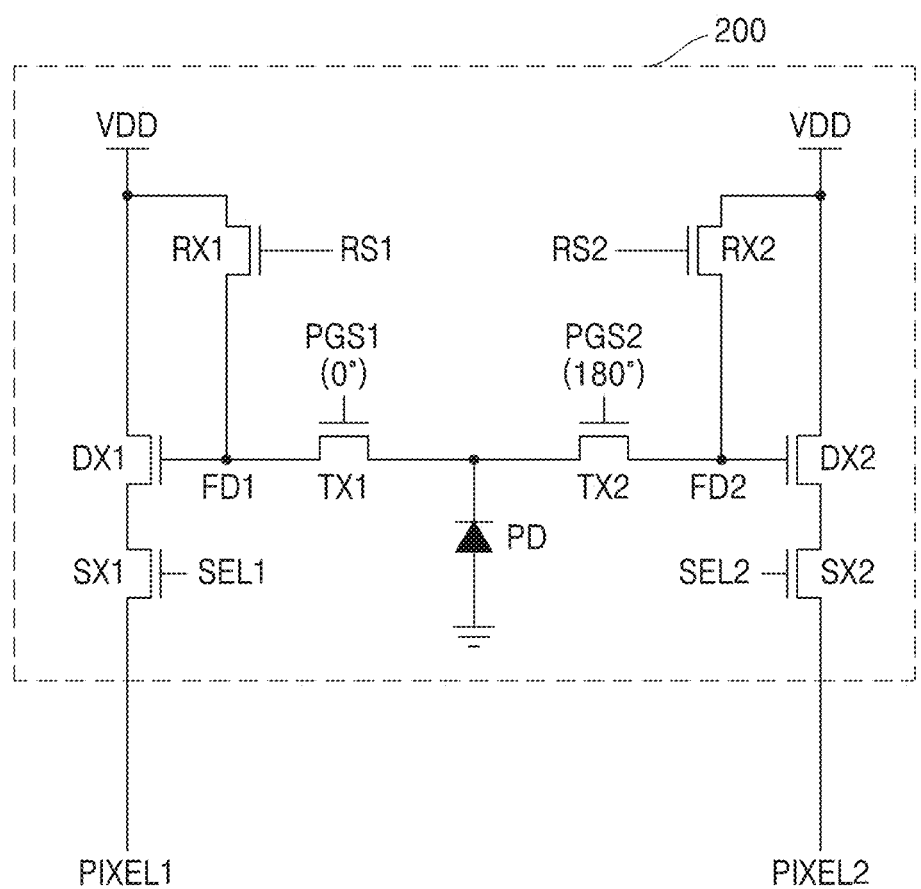
FIG. 3 is a diagram for explaining a structure of a pixel illustrated in FIG. 2 according to some example embodiments.

FIG. 3 is a diagram for explaining a structure of the pixel 200 illustrated in FIG. 2, according to some example embodiments.

Referring to FIG. 3, each pixel 200 of a plurality 201 of pixels 200 may include a photodiode PD, a first transmission transistor TX1 and a second transmission transistor TX2, a first reset transistor RX1 and a second reset transistor RX2, a first drive transistor DX1 and a second drive transistor DX2, and a first selection transistor SX1 and a second selection transistor SX2. According to some example embodiments, the first and/or second reset transistors RX1 and RX2, the first and/or second drive transistors DX1 and DX2, the first and/or second selection transistors SX1 and SX2, or any combination thereof may be omitted.

The photo diode PD may generate photoelectric charge that varies depending on the intensity of the reflected light beams reflected (for example, reflected light beams (36 and 37) in FIG. 2). In other words, the reflected light beams (36 and 37) may be converted into electrical signals. The electric signals (e.g., photoelectric charge) that may be generated by a photo diode may be referred to herein as a photoelectric signal. The photodiode PD, as an example of a photoelectric conversion element, may include a photo transistor, a photo gate, a pinned photo diode (PPD), or any combination thereof.

Each of the first and second transmission transistors TX1 and TX2 may transmit the generated photoelectric charge to a first floating diffusion node FD1 and a second floating diffusion node FD2 according to a first photo gate signal PGS1 and a second photo gate signal PGS2 output from the photo gate controller 100, respectively. The first and second photo gate signals PGS1 and PGS2 may be clock signals having the same frequency and different phases.

When the first photo gate signal PGS1 is at a high level, the first transfer transistor TX1 may transmit the photoelectric charge ("photoelectric signal") generated in the photodiode PD to the first floating diffusion node FD1. In some example embodiments, when the first photo gate signal PGS1 is at a low level, the first transfer transistor TX1 may not transmit the photoelectric charge generated in the photodiode PD to the first floating diffusion node FD1. In some example embodiments, when the second photo gate signal PGS2 is at a high level, the second transfer transistor TX2 may transmit the photoelectric charge generated in the photodiode PD to the second floating diffusion node FD2, and when the second photo gate signal PGS2 is at a low level, the second transfer transistor TX2 may not transmit the photoelectric charge generated in the photodiode PD to the second floating diffusion node FD2.

The pixels 200 may each have a two-tab pixel structure. The two-tab pixel structure may be referred to as a structure in which one pixel 200 includes two tabs. Here, the tab may denote a unit component that is capable of categorizing per phase and transmit photoelectric charges that are generated and accumulated inside a pixel 200 by irradiation of external light. A transmission method for the pixel 200 may be implemented, by using two tabs; one tab for about 0 degree phase and about 180 degree phase, and another tab for about 90 degree phase and about 270 degree phase. For example, one pixel may include a first tab unit including the first transfer transistor TX1, the first reset transistor RX1, the first drive transistor DX1, and the first select transistor SX1, and a second tab unit including the second transfer transistor TX2, the second reset transistor RX2, the second drive transistor DX2, and the second selection transistor SX2. The first tab unit may be a unit configured to transmit for the about 0 degree phase, and the second tab unit may be a unit configured to transmit for the about 180 degree phase. Alternatively, the first tab unit may be a unit configured to transmit for the about 90 degree phase, and the second tab unit may be a unit configured to transmit for the about 270 degree phase.

To calculate phase difference of reflected light beams (36 and 37) with respect to transmitted light beams (for example, (28 and 29) in FIG. 2), the first transmission transistor TX1 and the second transmission transistor TX2 may be provided with clock signals which have a constant frequency and a phase difference of about 90 degrees from each other.

In some example embodiments, in a first period, the first photo gate signal PGS1 may be a clock signal having a phase of about 0 degree, and the second photo gate signal PGS2 may have a phase of about 180 degrees with respect to the first photo gate signal PGS1. In some example embodiments, in a second period following the first period, the first photo gate signal PGS1 may be a clock signal having a phase of about 90 degrees, and the second photo gate signal PGS2 may be a clock signal having a phase of about 270 degrees with respect to the first photo gate signal PGS1.

In some example embodiments, the first photo gate signal PGS1, which is provided to a portion of the plurality 201 of pixels 200, may be a clock signal having a phase of about 0 degree, and the second photo gate signal PGS2 may have a phase of about 180 degrees with respect to the first photo gate signal PGS1. In some example embodiments, the first photo gate signal PGS1, which is provided to the other portion of the plurality 201 of pixels 200, may be a clock signal having a phase of about 90 degree, and the second photo gate signal PGS2 may have a phase of about 270 degrees with respect to the first photo gate signal PGS1.

In FIG. 3, a pixel having a two-tab structure is illustrated. The inventive concepts are not limited thereto, and the pixel having the two-tab structure of FIG. 3 is illustrated for convenience of explanation. The image sensor according to the inventive concepts may include a pixel of a one-tab structure, a pixel of a two-tab structure, a pixel of a three-tab structure, a pixel of a four-tab structure, or any combination thereof. For example, in the case of the pixel of the four-tab structure, four transmission transistors may be included, and each of four photo gate signals having a phase difference of about 90 degrees (for example, about 0 degree, about 90 degrees, about 180 degrees, and about 270) may be provided to a corresponding transmission transistor among the four transfer transistors.

According to a voltage potential by photoelectric charges accumulated in the first and second floating diffusion nodes FD1 and FD2, the first and second drive transistors DX1 and DX2 may amplify and transmit the photoelectric charges to the first and second selection transistors SX1 and SX2, respectively.

The first and second selection transistors SX1 and SX2 may include drain terminals which are connected to source terminals of the first and second drive transistors DX1 and DX2, and in response to each of the first and second selection control signals SEL1 and SEL2 output from the photo gate controller 100, may output ("transmit") the first and second pixel signals PIXEL1 and PIXEL2 to a read out circuit (for example, 46 in FIG. 2) via column lines, respectively. Each pixel 200 of the plurality 201 of pixels 200 may accumulate the photoelectric charges for a certain time period, for example, for an integration time, and output pixel signals generated according to a result of the accumulation.

In view of at least the above, it will be understood that each pixel 200 of the plurality 201 of pixels 200 may be configured to transmit a pixel signal (e.g., PIXEL1 and/or PIXEL2) that corresponds to a photoelectric signal (e.g., photoelectric charge generated at the photodiode PD of the pixel 200), and that the pixel 200 may be configured to transmit the pixel signal (e.g., PIXEL1 and/or PIXEL2) in response to a photo gate signal (e.g., PGS1 and/or PGS2).

The first and second reset transistors RX1 and RX2 may reset the first and second diffusion nodes FD1 and FD2 to a power voltage VDD according to the first and second reset control signals RS1 and RS2 output from the photo gate controller 100, respectively. In some example embodiments, a row driver (for example, 48 in FIG. 2) may generate control signals (RS1, RS2, SEL1, and SEL2) provided to the plurality 201 of pixels 200 according to the control of the timing controller 50.

Figure 4A:
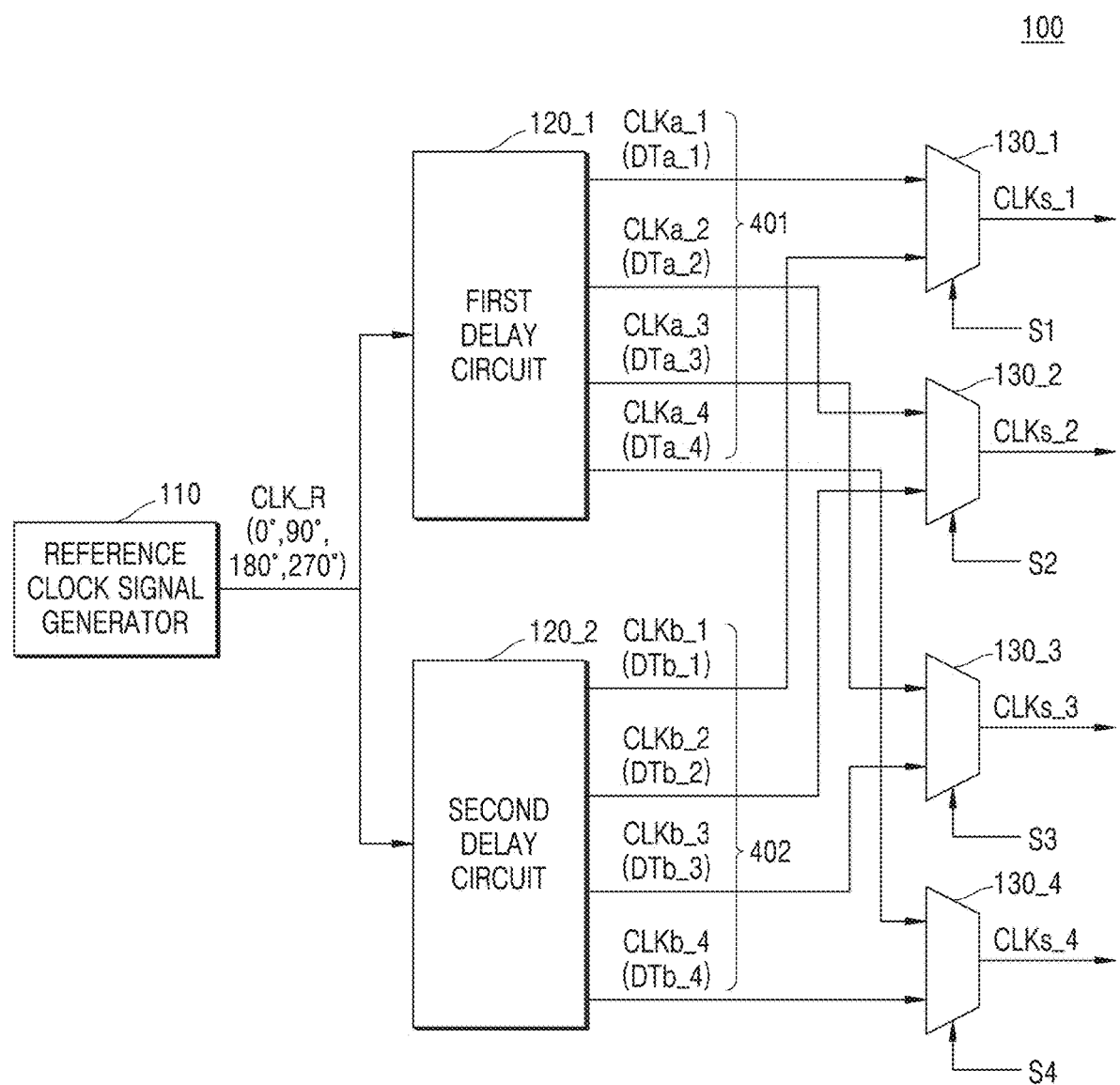
FIGS. 4A and 4B are block diagrams for explaining example structures of a photo gate controller illustrated in FIG. 2, respectively, according to some example embodiments.
Figure 4B:
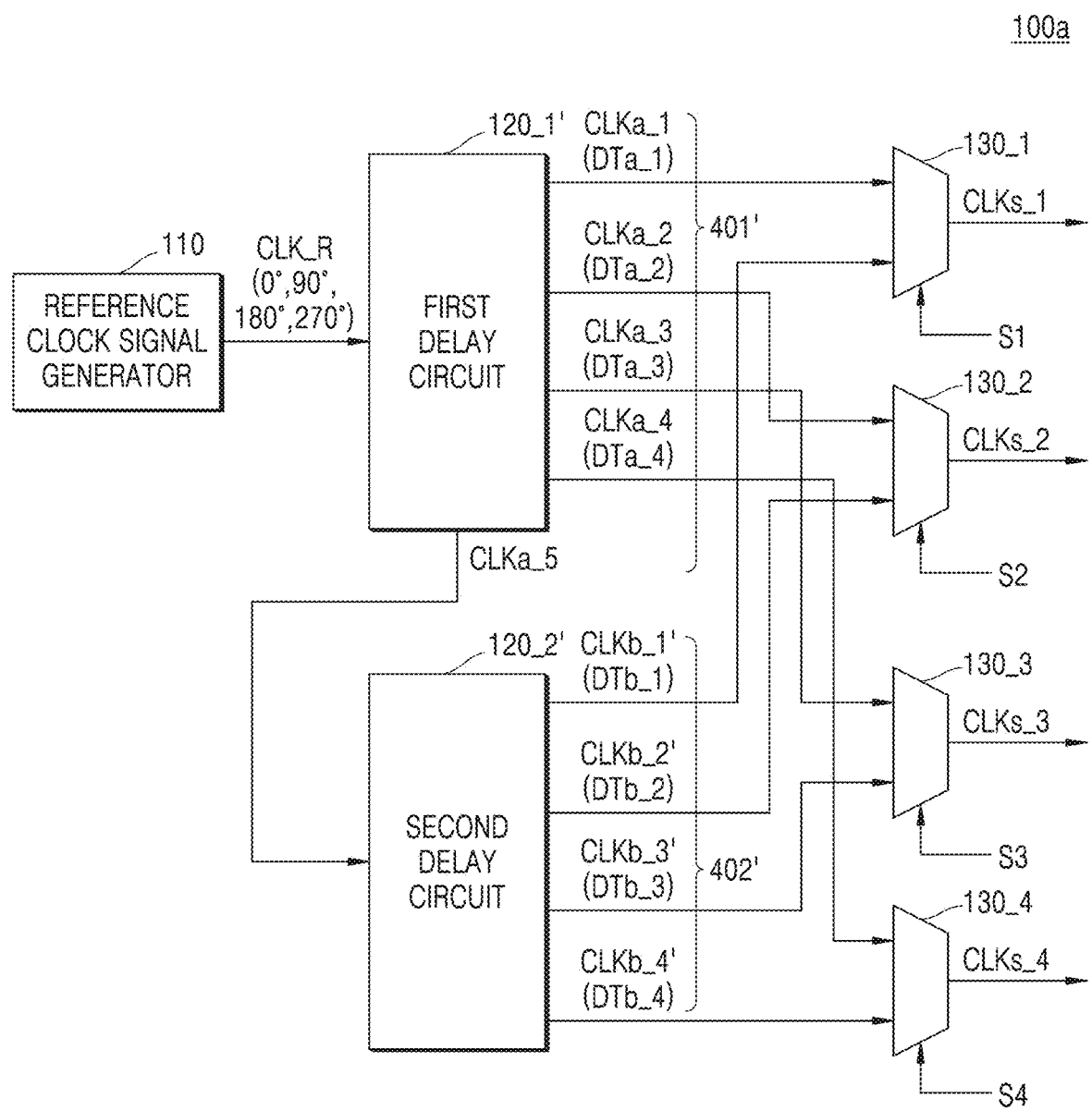

FIGS. 4A and 4B are block diagrams for explaining example structures of the photo gate controller 100 illustrated in FIG. 2, respectively, according to some example embodiments.

Referring to FIG. 4A, the photo gate controller 100 may include a reference clock signal generator 110, a first delay circuit 120_1, a second delay circuit 120_2, and first through fourth selectors 130_1 through 130_4. In some example embodiments, each of the first and second delay circuits 120_1 and 120_2 may include a buffer chain including a plurality of buffers. In some example embodiments, each delay circuit of the first and second delay circuits 120_1 and 120_2 may be implemented as a delay-locked loop (DLL) controlled by a timing controller (for example, 50 in FIG. 2). Restated, each delay circuit of the first delay circuit 120_1 and the second delay circuit 120_2 may include a delay-locked loop (DLL).

The reference clock signal generator 110 may generate a reference clock signal CLK_R. The reference clock signal CLK_R may have the same frequency as the transmission light beams (for example, (28 and 29) in FIG. 2). The reference clock signal CLK_R may include four clock signals having phases of about 0 degree, about 90 degrees, about 180 degrees, and about 270 degrees, respectively. Descriptions of the drawings below are given based on a clock signal having a phase of about 0 degree, but the descriptions below may be equally applied to clock signals having phases of about 90 degrees, about 180 degrees, and about 270 degrees.

The first delay circuit 120_1 may receive the reference clock signal CLK_R from the reference clock signal generator 110, and output first through fourth delay clock signals CLKa_1 through CLKa_4 which are delayed by a certain delay time, respectively. For example, the first delay clock signal CLKa_1 may be delayed from the reference clock signal CLK_R by a first delay time DTa_1, the second delay clock signal CLKa_2 may be delayed from the reference clock signal CLK_R by a second delay time DTa_2, the third delay clock signal CLKa_3 may be delayed from the reference clock signal CLK_R by a third delay time DTa_3, and the fourth delay clock signal CLKa_4 may be delayed from the reference clock signal CLK_R by a fourth delay time DTa_4. The delay clock signals output ("transmitted") by the first delay circuit 120_1 may be understood to be first delay clock signals 401. Accordingly, it will be understood that the first delay circuit 120_1 may be configured to transmit first delay clock signals 401 such that each first delay clock signal (e.g., CLKa_1 through CLKa_4) of the first delay clock signals 401 is delayed with respect to the reference clock signal CLK_R by a separate, respective particular amount of time (e.g., DTa_1 through DTa_4, respectively).

The second delay circuit 120_2 may receive the reference clock signal CLK_R from the reference clock signal generator 110, and output first through fourth delay clock signals CLKb_1 through CLKb_4 which are delayed by a certain delay time, respectively. For example, the first delay clock signal CLKb_1 may be delayed from the reference clock signal CLK_R by a first delay time DTb_1, the second delay clock signal CLKb_2 may be delayed from the reference clock signal CLK_R by a second delay time DTb_2, the third delay clock signal CLKb_3 may be delayed from the reference clock signal CLK_R by a third delay time DTb_3, and the fourth delay clock signal CLKb_4 may be delayed from the reference clock signal CLK_R by a fourth delay time DTb_4. The delay clock signals output ("transmitted") by the second delay circuit 120_2 may be understood to be second delay clock signals 402. Accordingly, it will be understood that the second delay circuit 120_2 may be configured to transmit second delay clock signals 402 such that each second delay clock signal (e.g., CLKb_1 through CLKb_4) of the second delay clock signals 402 is delayed with respect to the reference clock signal CLK_R by a separate, respective particular amount of time (e.g., DTb_1 through DTb_4, respectively). It will further be understood that the particular amounts of time by which the second delay clock signals 402 are delayed with respect to the reference clock signal CLK_R (e.g., DTb_1 through DTb_4) may be the same as or different from the particular amounts of time by which the first delay clock signals 401 are delayed with respect to the reference clock signal CLK_R (e.g., DTa_1 through DTa_4).

In some example embodiments, the first delay clock signal CLKa_1 output from the first delay circuit 120_1 and the first delay clock signal CLKb_1 output from the second delay circuit 120_2 may be delayed by different phases.

The first through fourth selectors 130_1 through 130_4 may receive delay clock signals from each of the first and second delay circuits 120_1 and 120_2, and may select one of the delay clock signals. In some example embodiments, the first selector 130_1 may receive the first delay clock signal CLKa_1 from the first delay circuit 120_1, and receive the first delay clock signal CLKb_1 from the second delay circuit 120_2. In response to a first selection signal S1 received from a timing controller (for example, 50 in FIG. 2), the first selector 130_1 may select one of the first delay clock signal CLKa_1 received from the first delay circuit 120_1 and the first delay clock signal CLKb_1 received from the second delay circuit 120_2, and may output a first selection clock signal CLKs_1, where the first selection clock signal CLKs_1 may be output as at least one photo gate signal of the photo gate signals generated by the photo gate signal controller 100. Restated, it will be understood that the first selector 130_1 may be configured to transmit, as one photo gate signal of the plurality of photo gate signals that may be transmitted by the photo gate signal controller 100, a first selection clock signal CLKs_1 selected between the first delay clock signal CLKa_1 transmitted by the first delay circuit 120_1 and the first delay clock signal CLKb_1 transmitted by the second delay circuit 120_2.

The description above of the first selector 130_1 may be applicable to operations of second through fourth selectors 130_2 through 130_4. Accordingly, in response to a second selection signal S2 received from the timing controller 50, the second selector 130_2 may output one of the second delay clock signals CLKa_2 received from the first delay circuit 120_1 and the second delay clock signal CLKb_2 received from the second delay circuit 120_2 as a second selection clock signal CLKs_2 where the second selection clock signal CLKs_2 may be output as a separate at least one photo gate signal of the photo gate signals generated by the photo gate signal controller 100. Restated, it will be understood that the second selector 130_2 may be configured to transmit, as a separate photo gate signal of the plurality of photo gate signals that may be transmitted by the photo gate signal controller 100, a second selection clock signal CLKs_2 selected between the second delay clock signal CLKa_2 transmitted by the first delay circuit 120_1 and the second delay clock signal CLKb_2 transmitted by the second delay circuit 120_2. In response to a third selection signal S3 received from the timing controller 50, the third selector 130_3 may output one of the third delay clock signals CLKa_3 received from the first delay circuit 120_1 and the third delay clock signal CLKb_3 received from the second delay circuit 120_2 as a third selection clock signal CLKs_3. In response to a fourth selection signal S4 received from the timing controller 50, the fourth selector 130_4 may output one of the fourth delay clock signals CLKa_4 received from the first delay circuit 120_1 and the fourth delay clock signal CLKb_4 received from the second delay circuit 120_2 as a fourth selection clock signal CLKs_4.

When the reference clock signal CLK_R is a clock signal having a phase of about 0 degree, each of the first through fourth selected clock signals CLKs_1 through CLKs_4 may be a first photo gate signal (for example, PGS1 in FIG. 3) provided to a first transmission transistor (for example, TX1 in FIG. 3) of one of different pixels 200 from each other. When the reference clock signal CLK_R is a clock signal having a phase of about 180 degree, each of the first through fourth selected clock signals CLKs_1 through CLKs_4 may be a second photo gate signal (for example, PGS2 in FIG. 3) provided to a second transmission transistor (for example, TX2 in FIG. 3) of one of different pixels 200 from each other. Accordingly, it will be understood that the photo gate controller 100, which may also be referred to herein as photo gate controller circuitry, may be configured to generate a plurality of photo gate signals (e.g., the first through fourth selected clock signals CLKs_1 to CLKs_4) and transmit separate, respective photo gate signals of the plurality of photo gate signals to separate, respective sets of one or more pixels 200 of the plurality 201 of pixels 200 (e.g., separate photo gate signals may be transmitted to separate, respective columns of pixels 200 of the plurality 201 of pixels 200). Restated, the photo gate controller 100 may be configured to transmit at least some signals of the first and second delay clock signals and that at least some signals (e.g., one or more signals of a combination of signals of the first delay clock signals and the second delay clock signals) are transmitted to the pixels 200 as photo gate signals, where separate, respective signals of the at least some signals may be transmitted to separate sets of one or more pixels 200, where each pixel 200 is configured to receive a photo gate signal and transmit a pixel signal in response to the photo gate signal received at the pixel in a frame, where each pixel 200 is configured to selectively receive, as the photo gate signal received at the pixel 200 in a frame, one signal among the first delay clock signals and the second delay clock signals.

In some example embodiments, each of the first through fourth selection clock signals CLKs_1 through CLKs_4 may be provided to pixels 200 arranged in different columns from each other. Description of the pixels 200 to which the first through fourth selection clock signals CLKs_1 through CLKs_4 are described below with reference to FIG. 7 and the like.

Referring to FIG. 4B, the photo gate controller 100a may include a reference clock signal generator 110, a first delay circuit 120_1', a second delay circuit 120_2', and the first through fourth selectors 130_1 through 130_4. The first delay circuit 120_1' may receive the reference clock signal CLK_R, and output a fifth delayed clock signal CLKa_5 delayed by a certain delay time (for example, a fifth delay time). The fifth delay clock signal CLKa_5 may be referred to herein as being one first delay clock signal of a plurality of first delay clock signals 401' transmitted by the first delay circuit 120_1', where the plurality of first delay clock signals 401' includes the first to fifth delay clock signals CLKa_1 through CLKa_5.

The second delay circuit 120_2' may receive the fifth delay clock signal CLKa_5 from the first delay circuit 120_1 (restated, the second delay circuit 120_2' may receive one first delay clock signal of the plurality of first delay clock signals 401'), and output first through fourth delay clock signals CLKb_1' through CLKb_4' (also referred to herein as second delay clock signals 402') each delayed by a certain delay time. For example, the first delay clock signal CLKb_1' may be delayed from the fifth delay clock signal CLKa_5 by the first delay time DTb_1, the second delay clock signal CLKb_2' may be delayed from the fifth delay clock signal CLKa_5 by the second delay time DTb_2, the third delay clock signal CLKb_3' may be delayed from the fifth delay clock signal CLKa_5 by the third delay time DTb_3, and the fourth delay clock signal CLKb_4' may be delayed from the fifth delay clock signal CLKa_5 by the fourth delay time DTb_4.

Figure 5:
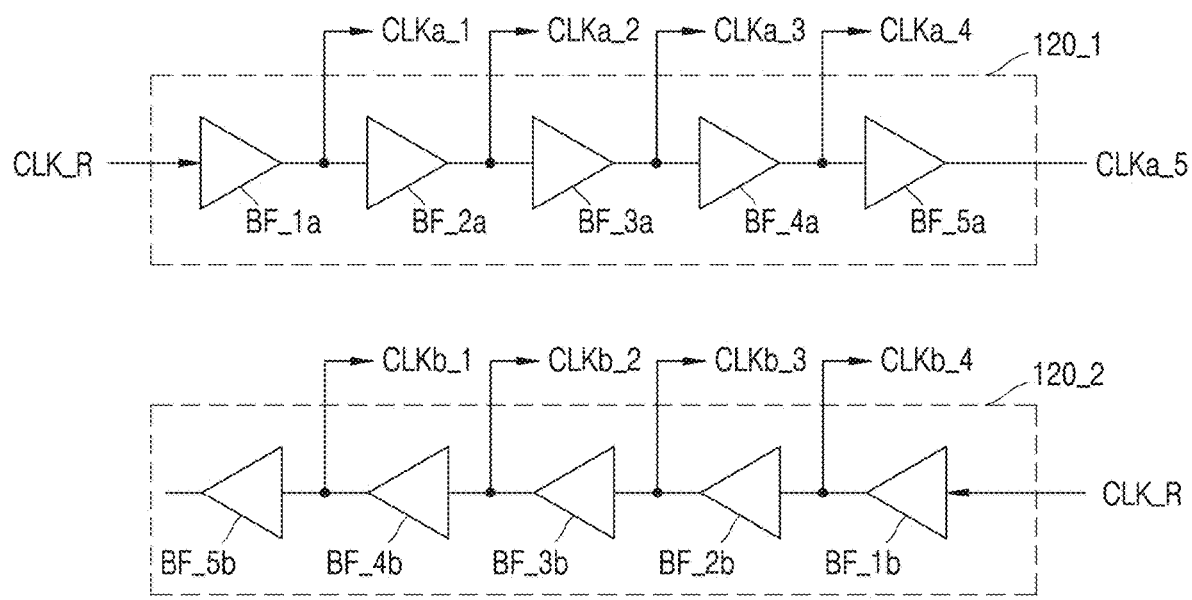
FIG. 5 illustrates circuit diagrams of a first delay circuit and a second delay circuit illustrated in FIG. 4A, respectively, according to some example embodiments.
Figure 6A:
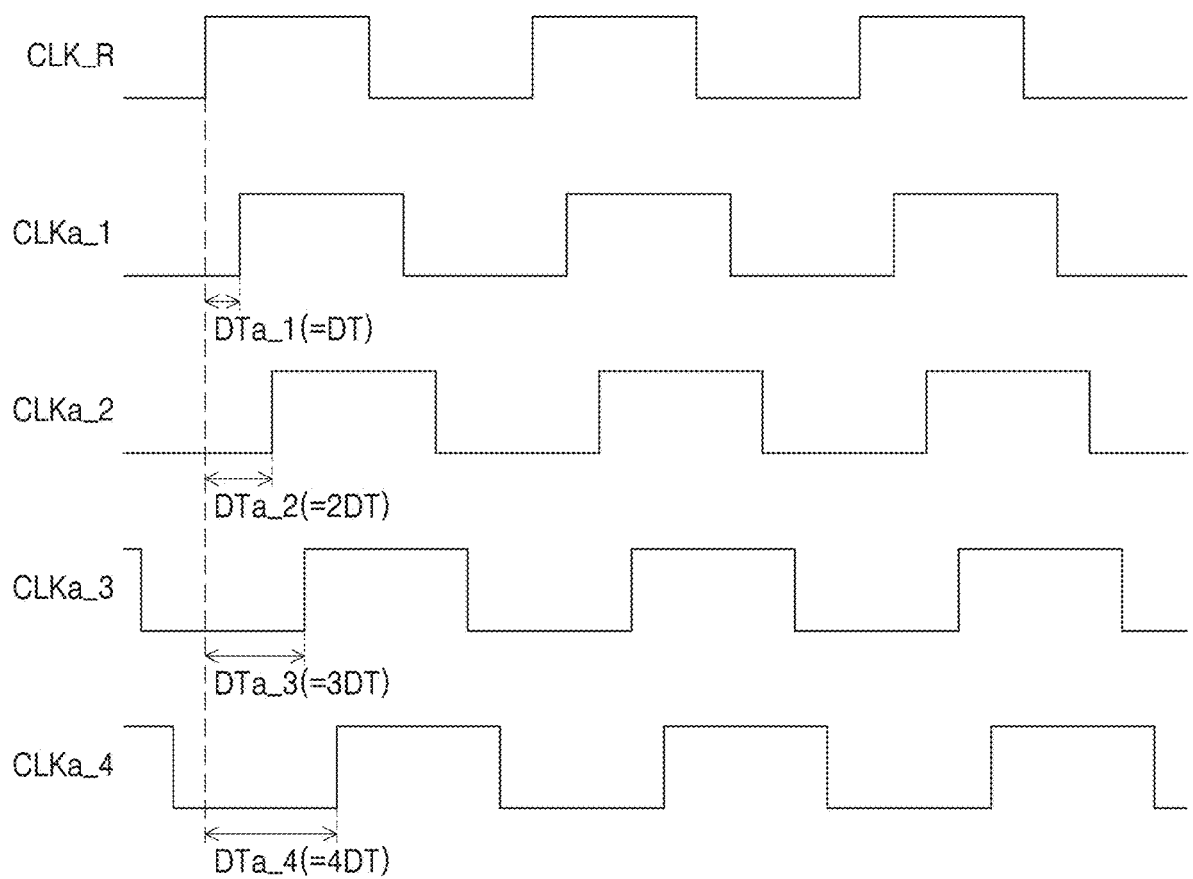
FIGS. 6A and 6B are timing diagrams for explaining phase differences between delay clock signals output from the first delay circuit and the second delay circuit in FIG. 5, respectively, according to some example embodiments.
Figure 6B:
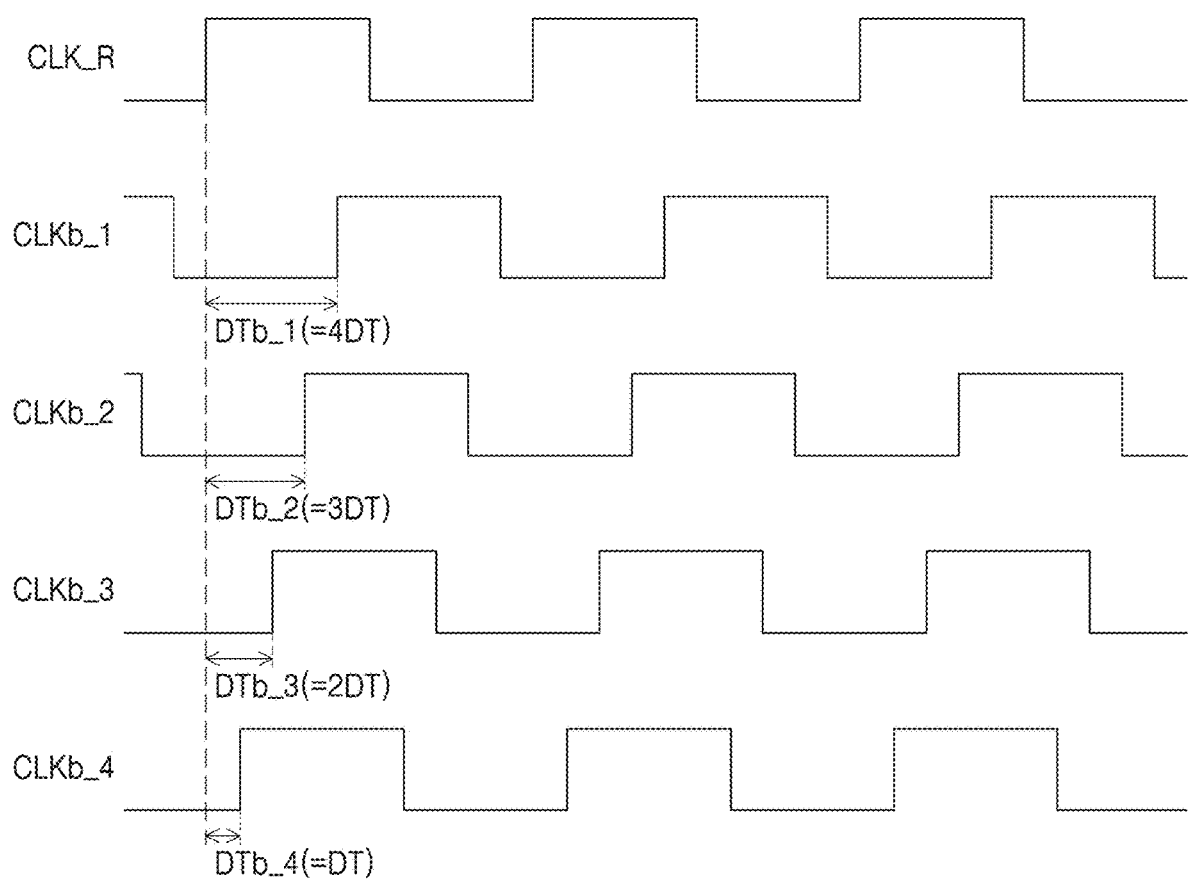

FIG. 5 illustrates circuit diagrams of the first delay circuit 120_1 and the second delay circuit 120_2 illustrated in FIG. 4A, respectively, according to some example embodiments. FIGS. 6A and 6B are timing diagrams for explaining phase differences between delay clock signals output from the first delay circuit 120_1 and the second delay circuit 120_2 in FIG. 5, respectively, according to some example embodiments.

Referring to FIG. 5, each of the first delay circuit 120_1 and the second delay circuit 120_2 may include a buffer chain including a plurality of buffers BF_1a through BF_5a and BF_1b through BF_5b connected to each other in series, respectively. Restated, each delay circuit of the first delay circuit 120_1 and the second delay circuit 120_2 may include a separate plurality of buffers that are connected to each other in series, such that buffers BF_1a through BF_5a are connected to each other in series and buffers BF_1b through BF_5b are connected to each other in series separately from buffers BF_1a through BF_5a. The first through fourth delay clock signals (CLKa_1 through CLKa_4 and CLKb_1 through CLKb_4) may be respectively output from different nodes between the buffers included in the first delay circuit 120_1 and the second delay circuit 120_2. Each of the first through fourth delay clock signals (CLKa_1 through CLKa_4 and CLKb_1 through CLKb_4) may have a long phase delay time as being transmitted through a large number of buffers. In some example embodiments, the phase difference of the first through fourth delay clock signals CLKa_1 through CLKa_4 output from the first delay circuit 120_1 may not exceed about 360 degrees. In some example embodiments, in some example embodiments, the phase difference of the first through fourth delay clock signals CLKb_1 to CLKb_4 output from the second delay circuit 120_2 may not exceed about 360 degrees.

Referring to FIGS. 5 and 6A, the first through fourth delay clock signals CLKa_1 through CLKa_4 output from the first delay circuit 120_1 may have gradually longer delay times and gradually larger phase differences from the reference clock signal CLK_R, in an increasing order from the first delay clock signal CLKa_1 to the fourth delay clock signal CLKa_4. For example, when the first delay time DTa_1 has a value of DT, the second delay time DTa_2 may have a value of 2*DT such that the second delay clock signal CLKa_2 that may be transmitted by the first delay circuit 120_1 may have a longer delay time than the first delay clock signal CLKa_1 that may be transmitted by the first delay circuit 120_1, the third delay time DTa_3 may have a value of 3*DT, and the fourth delay time DTa_4 may have a value of 4*DT. However, this is an example for convenience of explanation, and the inventive concepts are not limited to the second through fourth delay times DTa_2 through DTa_4 being a multiple of the first delay time DTa_1. Magnitudes of the first through fourth delay times DTa_1 through DTa_4 may vary depending on a circuit configuration of the nodes and the first delay circuit 120_1 from which each of the first through fourth delay clock signals CLKa_1 through CLKa_4 are output.

Referring to FIGS. 5 and 6B, compared with the case of the first delay circuit 120_1, the first through fourth delay clock signals CLKb_1 through CLKb_4 output from the second delay circuit 120_2 may have gradually shorter delay times and gradually less phase differences from the reference clock signal CLK_R, in a decreasing order from the first delay clock signal CLKb_1 to the fourth delay clock signal CLKb_4. For example, when the fourth delay time DTb_4 has a value of DT, the third delay time DTb_3 may have a value of 2*DT, the second delay time DTb_2 may have a value of 3*DT such that the second delay clock signal CLKb_2 that may be transmitted by the second delay circuit 120_2 may have a shorter delay time than the first delay clock signal CLKb_1 that may be transmitted by the second delay circuit 120_2, and the first delay time DTb_1 may have a value of 4*DT. However, this is an example for convenience of explanation, and the inventive concepts are not limited to the first through third delay times DT_1 through DTb_3 being a multiple of the fourth delay time DTb_4. Magnitudes of the first through fourth delay times DTb_1 through DTb_4 may vary depending on a circuit configuration of the nodes and the second delay circuit 120_2 from which each of the first through fourth delay clock signals CLKb_1 through CLKb_4 are output.

Figure 7:
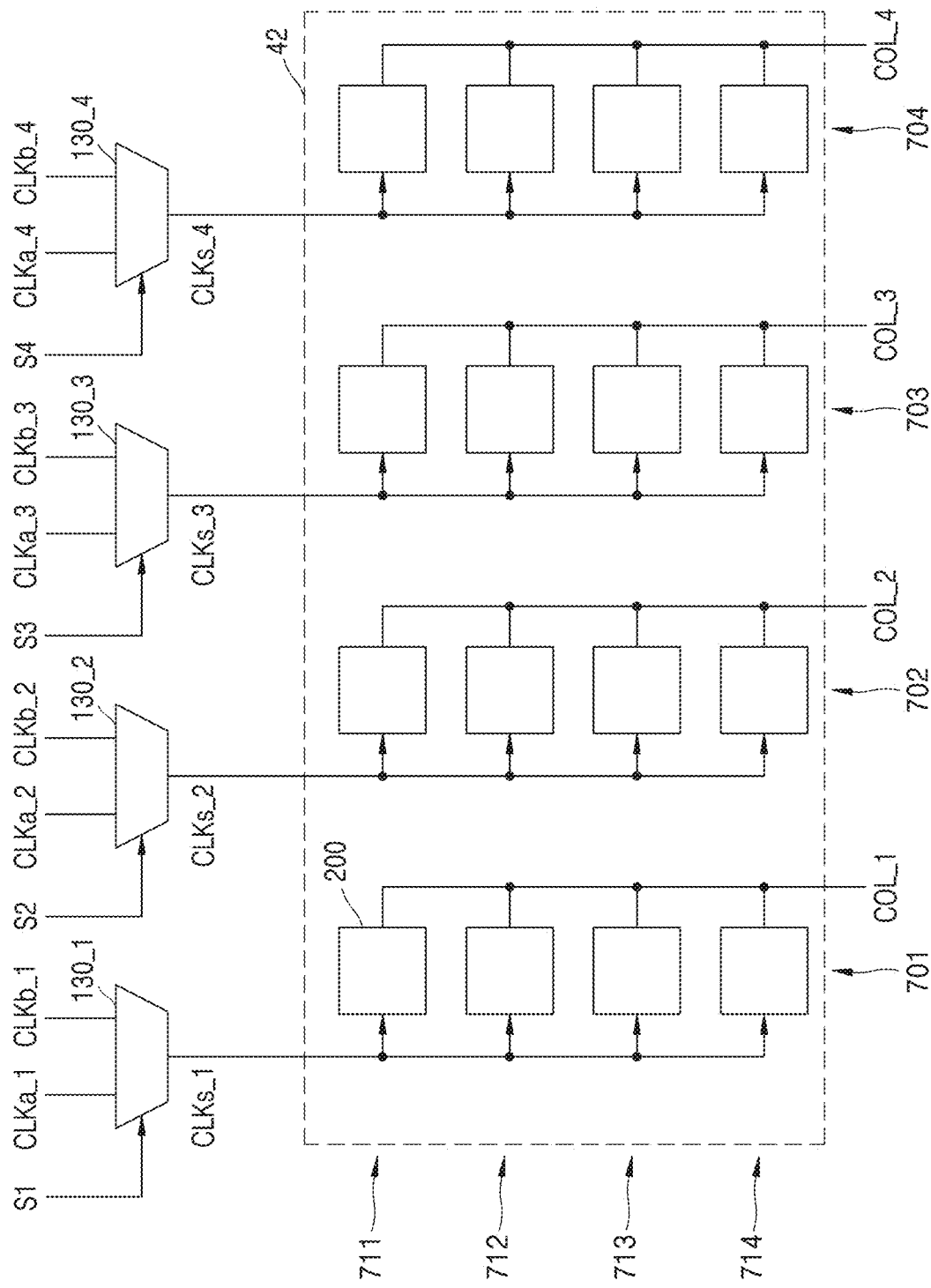
FIG. 7 is a diagram for illustrating a photo gate signal provided to a pixel array of an image sensor, according to some example embodiments.
Figure 8:
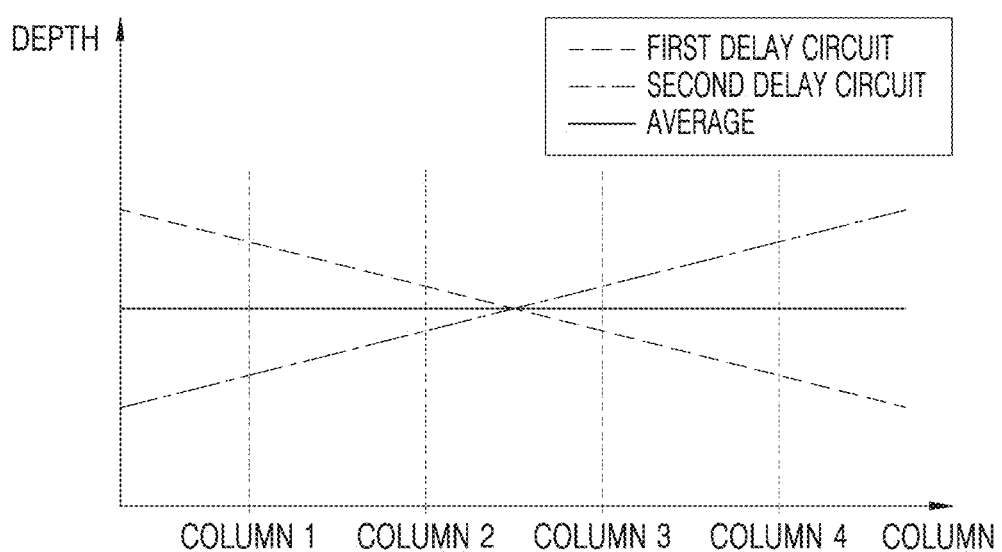
FIG. 8 is a graph illustrating depth information obtained according to a photo gate signal provided to the pixel array, according to some example embodiments.

FIG. 7 is a diagram for illustrating a photo gate signal provided to the pixel array 42 of the image sensor 24, according to some example embodiments. FIG. 8 is a graph illustrating depth information obtained according to the photo gate signal provided to the pixel array 42, according to some example embodiments. The photo gate signal of FIG. 7 may be the first photo gate signal PGS1 in FIG. 3, but the description of FIG. 7 may also be applied to the second photo gate signal PGS2. In FIG. 7, descriptions already given with reference numerals in reference to FIG. 4A and the like are omitted.

In some example embodiments, the plurality 201 of pixels 200 includes an array 42 of pixels that includes a plurality of columns of pixels and a plurality of rows of pixels, where each column of pixels includes a separate set of pixels 200. Referring to FIG. 7, for example, at least a portion of the pixel array 42 may include an array of sixteen pixels 200 arranged in a matrix shape of four rows (711, 712, 713, 714) and four columns (701, 702, 703, 704) where each separate column 701-704 of pixels 200 includes a separate set of pixels 200. Although only a portion of the pixel array 42 including four rows and four columns is described herein for convenience of explanation, all rows and columns included in the pixel array 42 may operate in the same manner, and the number ("quantity") of rows and columns may be variously configured.

In some example embodiments, the same clock signal may be provided as the first photo gate signal PGS1 to the pixel array 42 on a column-by-column basis. Restated, and as shown in FIG. 7, a given set of pixels 200 included in a given (e.g., same) column of pixels (e.g., 701) of the plurality of columns of pixels (e.g., 701-704) may be configured to receive identical photo gate signals (e.g., CLKs_1). For example, as shown in FIG. 7, the first selection clock signal CLKs_1 may be provided to a first column 701 of pixels 200 such that the set of pixels 200 included in column 701 are each configured to receive the first selection clock signal CLKs_1 as a respective photo gate signal and thus the set of pixels 200 included in column 701 receive identical photo gate signals, the second selection clock signal CLKs_2 may be provided to a second column 702 of pixels 200 such that the set of pixels 200 included in column 702 are each configured to receive the second selection clock signal CLKs_2 as a respective photo gate signal and thus the set of pixels 200 included in column 702 receive identical photo gate signals, the third selection clock signalCLKs_3 may be provided to a third column 703 of pixels 200 such that the set of pixels 200 included in column 703 are each configured to receive the third selection clock signal CLKs_3 as a respective photo gate signal and thus the set of pixels 200 included in column 703 receive identical photo gate signals, and the fourth selection clock signal CLKs_4 may be provided to a fourth column 704 of pixels 200 such that the set of pixels 200 included in column 704 are each configured to receive the fourth selection clock signal CLKs_4 as a respective photo gate signal and thus the set of pixels 200 included in column 704 receive identical photo gate signals. In some example embodiments, the first selection clock signal CLKs_1 that the pixels 200 of the first column 701 are configured to receive as a photo gate signal may be a first delay clock signal of the plurality of first delay clock signals 401 transmitted by the first delay circuit 120_1, and the second selection clock signal CLKs_2 that the pixels 200 of the second column 702 are configured to receive as a photo gate signal may be a second delay clock signal of the plurality of second delay clock signals 402 transmitted by the second delay circuit 120_2. The first column 701 and second column 702 of pixels may be adjacent to each other, out of the plurality of columns of pixels included in the array 42.

A first pixel signal COL_1 may be output through a first column line connected to the first column, a second pixel signal COL_2 may be output through a second column line connected to the second column, a third pixel signal COL_3 may be output through a third column line connected to the third column line, and a fourth pixel signal COL_4 may be output through a fourth column line connected to the fourth column. In the case where the plurality 201 of pixels 200 have a two-tab pixel structure, each of the first through fourth pixel signals COL_1 through COL_4 may include a first pixel signal PIXEL1 and a second pixel signal PIXEL2 in FIG. 3. However, the inventive concepts are not limited thereto, and in the case where the plurality 201 of pixels 200 have a four-tab pixel structure, each of the first through fourth pixel signals COL_1 through COL_4 may include four different pixel signals from each other.

Referring to FIGS. 5, 7, and 8, since each of the pixels 200 performs a sampling operation on electrical signals generated by reflected light beams (36 and 37) by using the first photo gate signal PGS1, magnitudes of the first through fourth output pixel signals COL_1 through COL_4 may be changed as the phase of the first photo gate signal PGS1 is changed.

When the first through fourth delay clock signals CLKa_1 through CLKa_4 output from a first delay circuit (for example, 120_1 in FIG. 4A) are provided as the first photo gate signal PGS1 to the first column through the fourth column, respectively, the phase delay time of the provided first photo gate signal PGS1 may be longer in a direction from the first column toward the fourth column. Accordingly, even when depth information is obtained for the 3D object 26 having a plane of the same depth, a result may be obtained such that the depth is measured as being shallower in a direction from the first column toward the fourth column. In other words, a tilt may be generated in a result of a depth measurement. Thus, a calibration operation for correcting the generated tilt may be required to be performed separately in a processor (for example, 19 in FIG. 2).

In some example embodiments, when the first through fourth delay clock signals CLKb_1 through CLKb_4 output from a second delay circuit (for example, 120_2 in FIG. 4A) are provided as the first photo gate signal PGS1 to the first column through the fourth column, respectively, the phase delay time of the provided first photo gate signal PGS1 may be longer in a direction from the fourth column toward the first column. Accordingly, even when the depth information is obtained for the 3D object 26 having a plane of the same depth, a result may be obtained such that the depth is measured as being deeper in a direction from the first column toward the fourth column. In other words, a measurement tilt opposite to that in the case of using the first through fourth delay clock signals CLKa_1 through CLKa_4 output from the first delay circuit 120_1 may be generated. Thus, a calibration operation for correcting the generated tilt may be required to be performed separately in the processor 19.

In some example embodiments, when delay clock signals having an identical phase delay time are provided as the first photo gate signal PGS1 by a reference clock signal generator (for example 110 in FIG. 4A) to each pixel of the first column through the fourth column via a buffer tree configured by the plurality of buffers, time points at which the photo gate signal PGS1 provided to each of the pixels 200 is activated may coincide with each other. Thus, since the magnitude of the current required to provide the first photo gate signal PGS1 to each of the pixels 200 is increased, a burden on the image sensor 24 may be increased. In some example embodiments, as the magnitude of the current increases, the magnitude of a voltage drop increases, and accordingly, a malfunction of internal circuits of the image sensor 24 may occur.

The image sensor 24 may decrease noise of the depth information that is generated as the phase delay time of the clock signal provided to each of the pixels 200 varies, by providing selectively to the pixel array 42 the first through fourth delay clock signals CLKa_1 through CLKa_4 output from the first delay circuit 120_1 and the first through fourth delay clock signals CLKb_1 through CLKb_4 output from the second delay circuit 120_2, and by obtaining accordingly the first through fourth pixel signals COL_1 through COL_4. In other words, the depth tilt generated by using the first through fourth delay clock signals CLKa_1 through CLKa_4 output from the first delay circuit 120_1 and the depth tilt generated by using the delay clock signals CLKb_1 through CLKb_4 output from the second delay circuit 120_2 may be compensated by each other.

Detailed descriptions of a method of providing selectively to the pixel array 42 the first through fourth delay clock signals CLKa_1 through CLKa_4 output from the first delay circuit 120_1 and the first through fourth delay clock signals CLKb_1 through CLKb_4 output from the second delay circuit 120_2 are given below with reference to FIGS. 10 and 11, and the like.

Figure 9:
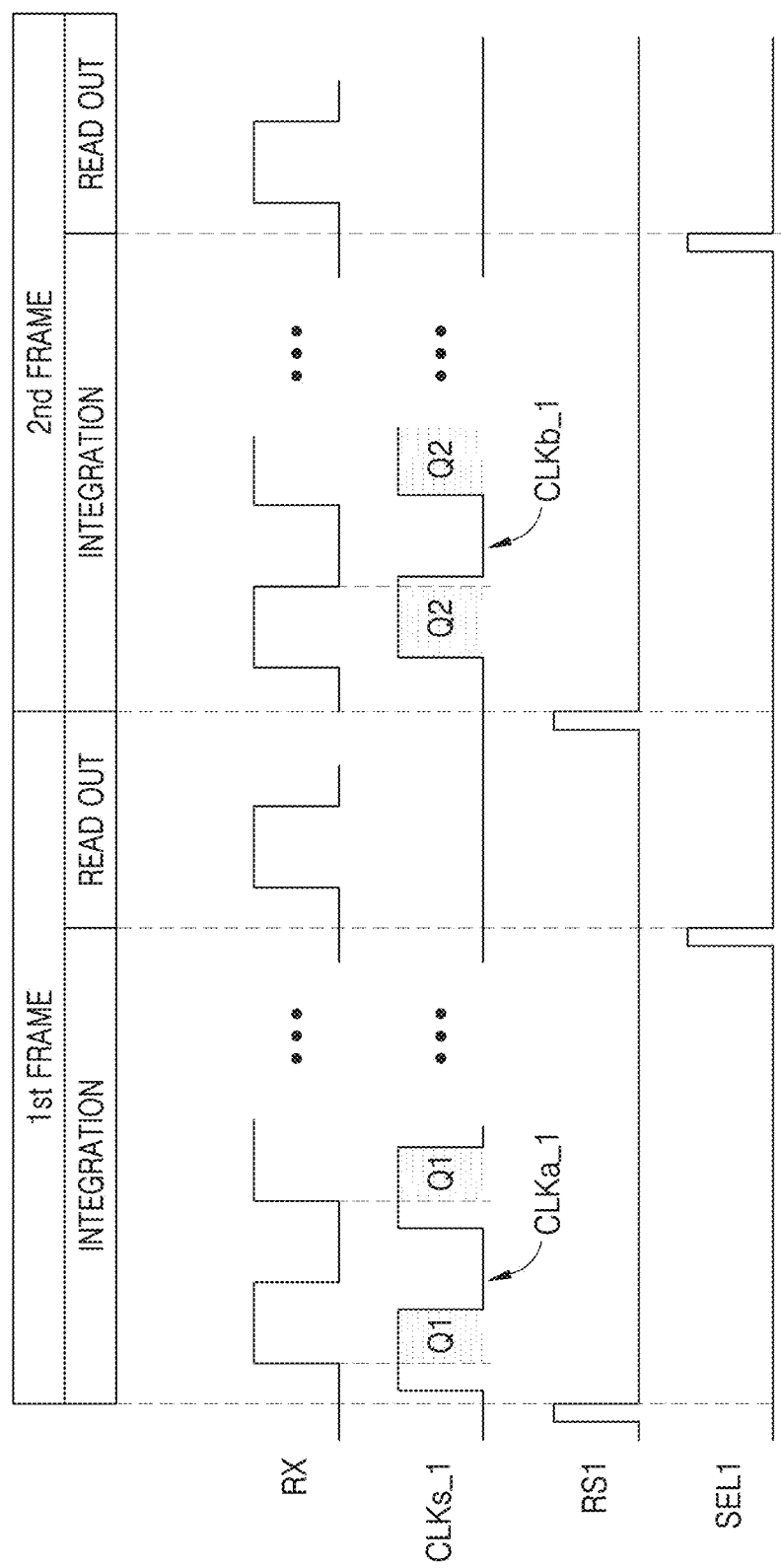
FIG. 9 is a timing chart for explaining the first photo gate signal provided to a plurality of pixels in FIG. 7, according to some example embodiments.

FIG. 9 is a timing chart for explaining the first photo gate signal PGS1 provided to the plurality 201 of pixels 200 in FIG. 7, according to some example embodiments. Here, one frame may correspond to the period of time required for completing one cycle of accumulation of photoelectric charges for a pixel array (for example, 42 in FIG. 7), generation of pixel signals, and the read out. Accordingly, it will be understood that each pixel 200 may be configured to transmit a pixel signal (e.g., PIXEL1 and/or PIXEL2) in response to a photo gate signal (e.g., PGS1 and/or PGS2) in a frame. In FIG. 9, operations are described for one tab (or a first tab) included in each of the pixels 200, but the following description may be applied to all other tabs included in each of the pixels 200. In some example embodiments, although signals provided to the pixels 200 connected to the first column are illustrated in FIG. 9, contents may also be applied to signals provided to the pixels 200 connected to the columns other than the first column (for example, the second through fourth columns).

Referring to FIGS. 3 and 9, in measuring a distance between the 3D object 26 and the plurality 201 of pixels 200, the reset signal RS1 may be activated before the integration period, and the plurality 201 of pixels 200 may reset the first floating diffusion node FD1. The transmission light beams (28 and 29) irradiated to the 3D object 26 during the integration period may be reflected by the 3D object 26 and reach the plurality 201 of pixels 200 as a reflected light beam RX (for example, (36 and 37) in FIG. 2). In this case, the reflected light beam RX is illustrated as a square wave, but this is for convenience of explanation, and a waveform of the reflected light beam RX may be variously formed.

Photoelectric charges may be generated in the photo diode PD, which is a photo detection area, based on the reflected light beam RX. The first selection clock signal CLKs_1 which periodically has an activated period (for example, a high level period) and an inactive period (for example, a low level period) in the light integration period may be received as the first photo gate signal PGS1 by the first column.

According to the activated period of the first selection clock signal CLKs_1, a first photoelectric charge Q1 may be stored at the first floating diffusion node FD1 in a first frame, and according to the activated period of the first selection clock signal CLKs_1, a second photoelectric charge Q2 may be stored at the first floating diffusion node FD1. The selection control signal SEL1 may be activated before the read out period, and in the first frame, pixel signals corresponding to the first photoelectric charge Q1 (or, COL_1 through COL_4) may be generated, and in the second frame, pixel signals corresponding to the second photoelectric charge Q2 (or, COL_1 through COL_4) may be generated.

Referring to FIGS. 7 and 9, in the first frame, the first through fourth selectors 130_1 through 130_4 may select the first through fourth delay clock signals CLKa_1 through CLKa_4 of the first delay clock signals 401 output from the first delay circuit 120_1 in response to the first through fourth selection signals S1 through S4, respectively. In other words, the plurality 201 of pixels 200 may be provided with the first through fourth delay clock signals CLKa_1 through CLKa_4 of the first delay clock signals 401 output from the first delay circuit 120_1 as the photo gate signals. Restated, the plurality 201 of pixels 200 may be configured to receive one or more first delay clock signals of the first delay clock signals 401 as the photo gate signals received at the plurality 201 of pixels 200 in a first frame and may accordingly transmit a first pixel signal COL_1 based on the photo gate signal received in the first frame. Further restated, for example the first and second selectors 130_1 and 130_2 may be configured to select the first delay clock signal CLKa_1 and the second delay clock signal CLKa_2 transmitted by the first delay circuit 120_1, respectively, in a first frame.

For example, the first column may be provided with the first delay clock signal CLKa_1 output from the first delay circuit 120_1 as the first selection clock signal CLKs_1. The first photoelectric charge Q1 corresponding to the activated period of the first delay clock signal CLKa_1 output from the first delay circuit 120_1 may be accumulated in a first floating diffusion region, and the first pixel signal COL_1 corresponding to the first photoelectric charge Q1 may be output. The above description of the first column may be identically applied to the second through fourth columns.

In some example embodiments, in the second frame, the first through fourth selectors 130_1 through 130_4 may select the first through fourth delay clock signals CLKb_1 through CLKb_4 of the second delay clock signals 402 output from the second delay circuit 120_2 in response to the first through fourth selection signals S1 through S4, respectively. In other words, the plurality 201 of pixels 200 may be provided with the first through fourth delay clock signals CLKb_1 through CLKb_4 of the second delay clock signals 402 output from the second delay circuit 120_2 as the photo gate signals. Restated, the plurality 201 of pixels 200 may be configured to receive one or more second delay clock signals of the second delay clock signals 402 as the photo gate signals received at the plurality 201 of pixels 200 in a second frame and may accordingly transmit a second pixel signal COL_2 based on the photo gate signal received in the second frame. Further restated, for example the first and second selectors 130_1 and 130_2 may be configured to select the first delay clock signal CLKb_1 and the second delay clock signal CLKb_2 transmitted by the second delay circuit 120_2, respectively, in a second frame that follows ("is subsequent to") the first frame.

For example, the first column may be provided with the first delay clock signal CLKb_1 output from the second delay circuit 120_2 as the first selection clock signal CLKs_1. The second photoelectric charge Q2 corresponding to the activated period of the first delay clock signal CLKb_1 output from the second delay circuit 120_2 may be accumulated in the first floating diffusion region, and the first pixel signal COL_1 corresponding to the second photoelectric charge Q2 may be output. The above description of the first column may be identically applied to the second through fourth columns.

A read out circuit (for example, 46 in FIG. 2) may perform an operation of interpolating the first through fourth pixel signals COL_1 through COL_4 in the first frame and the first through fourth pixel signals COL_1 through COL_4 in the second frame. For example, the read out circuit 46 may obtain the ToF by averaging the first through fourth pixel signals COL_1 through COL_4 in the first frame and the first through fourth pixel signals COL_1 through COL_4 in the second frame, and may obtain the depth information of the 3D object 26, which is the distance information between the 3D object 26 and the plurality 201 of pixels 200. As a result, for example, the read out circuit may obtain the depth information based on interpolating a first pixel signal COL_1, transmitted by some or all pixels 200 of the plurality of pixels in response to the first delay clock signal, and a second pixel signal COL_2, transmitted by the some or all pixels 200 in response to the second delay clock signal.

The image sensor according to the inventive concepts may use the first through fourth delay clock signals CLKa_1 through CLKa_4 output from the first delay circuit 120_1 in the first frame, and the first through fourth delay clock signals CLKb_1 through CLKb_4 output from the second delay circuit 120_2 in the second frame. In other words, by providing selectively to the pixel array 42 the first through fourth delay clock signals CLKa_1 through CLKa_4 output from the first delay circuit 120_1 and the first through fourth delay clock signals CLKb_1 through CLKb_4 output from the second delay circuit 120_2, the image sensor 24 may decrease noise of the depth information that is generated as the phase delay times of clock signals provided to each of the pixels 200 vary.

Figure 10:
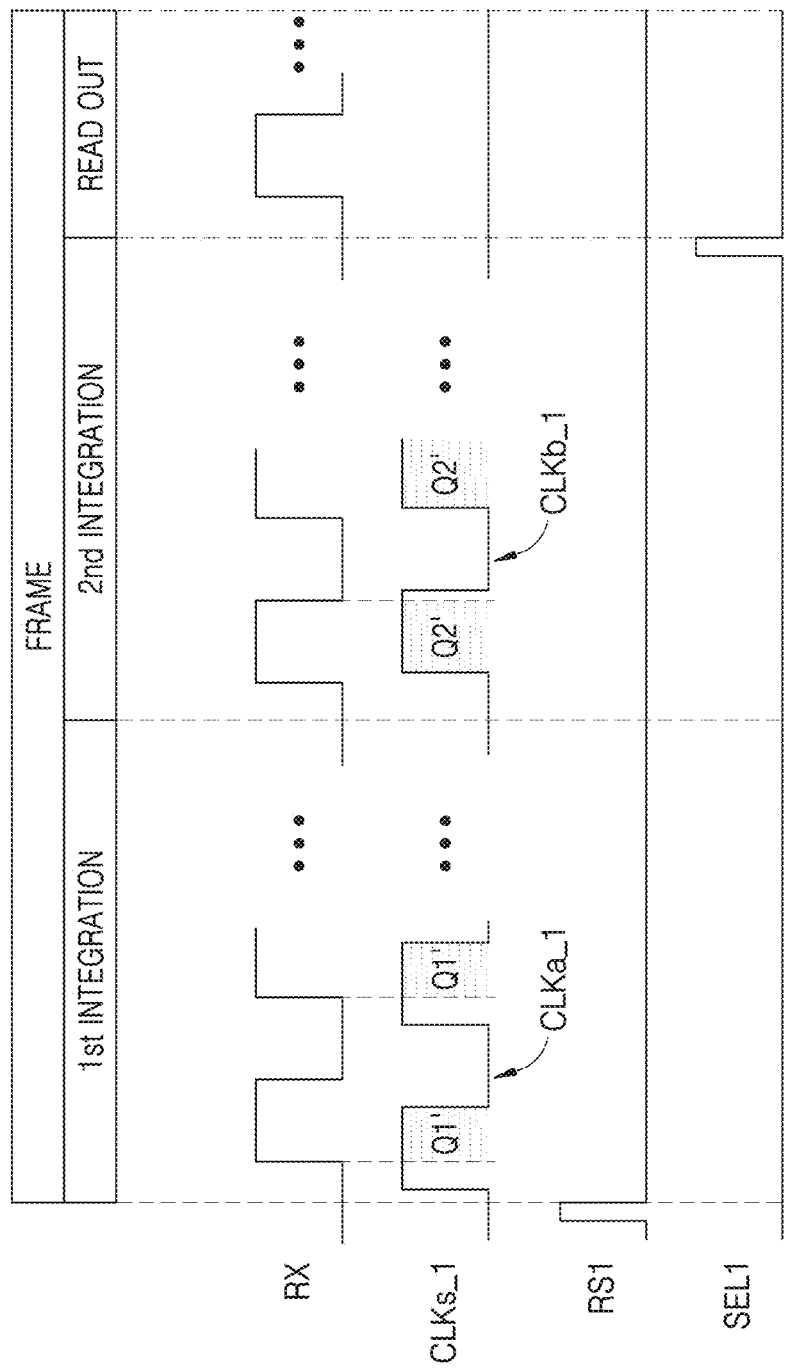
FIG. 10 is a timing chart for explaining the first photo gate signal provided to the plurality of pixels in FIG. 7, according to some example embodiments.

FIG. 10 is a timing chart for explaining the first photo gate signal PGS1 provided to the plurality 201 of pixels 200 in FIG. 7, according to some example embodiments. Descriptions already given with reference to FIG. 9 are omitted in FIG. 10. Although signals provided to the pixels 200 connected to the first column are illustrated in FIG. 10, contents may also be applied to signals provided to the pixels 200 connected to the columns other than the first column (for example, the second through fourth columns).

Referring to FIGS. 7 and 10, one frame may include a first integration period and a second integration period. In some example embodiments, a length ("duration") of the first integration period and that of the second integration period may be equal, but are not limited thereto. Restated, a duration of the first integration period may be identical to, or different than, a duration of the second integration period.

In the first integration period, the first through fourth selectors 130_1 through 130_4 may select the first through fourth delay clock signals CLKa_1 through CLKa_4 output from the first delay circuit 120_1 in response to the first through fourth selection signals S1 through S4, respectively. In other words, in the first integration period, the plurality 201 of pixels 200 may be provided with the first through fourth delay clock signals CLKa_1 through CLKa_4 of the first delay clock signals 401 output from the first delay circuit 120_1 as the photo gate signals received at the pixels 200. A first photoelectric charge Q1' corresponding to the activated period of the first through fourth delay clock signals CLKa_1 through CLKa_4 output from the first delay circuit 120_1 may be accumulated in the first floating diffusion region. Restated, each pixel 200 of the plurality 201 of pixels 200 may be configured to receive one or more first delay clock signals as the photo gate signal in the first integration period and accumulate light charges corresponding to a photoelectric signal (e.g., first photoelectric charge Q1') in response to the photo gate signal received at the pixel 200 in the first integration period. Further restated, for example, the first selector 130_1 and the second selector 130_2 may be configured to select the first delay clock signal CLKa_1 and the second delay clock signal CLKa_2 transmitted by the first delay circuit 120_1, respectively, in the first integration period.

In some example embodiments, in the second integration period, the first through fourth selectors 130_1 through 130_4 may select the first through fourth delay clock signals CLKb_1 through CLKb_4 of the second delay clock signals 402 output from the second delay circuit 120_2 in response to the first through fourth selection signals S1 through S4, respectively. The plurality 201 of pixels 200 may be provided with the first through fourth delay clock signals CLKb_1 through CLKb_4 of the second delay clock signals 402 output from the second delay circuit 120_2 as the photo gate signals. A second photoelectric charge Q2' corresponding to the activated period of the first through fourth delay clock signals CLKb_1 through CLKb_4 output from the second delay circuit 120_2 may be accumulated in the first floating diffusion region. Restated, each pixel 200 of the plurality 201 of pixels 200 may be configured to receive one or more second delay clock signals as the photo gate signal in the second integration period and accumulate light charges corresponding to a photoelectric signal (e.g., first photoelectric charge Q2') in response to the photo gate signal received at the pixel 200 in the second integration period. Thus, each pixel 200 may be configured to accumulate light charges corresponding to one or more photoelectric signals (e.g., Q1' and Q2') in response to one or more photo gate signals received at the pixel 200 in the first integration period and the second integration period. Further restated, for example, the first selector 130_1 and the second selector 130_2 may be configured to select the first delay clock signal CLKb_1 and the second delay clock signal CLKb_2 transmitted by the second delay circuit 120_2, respectively, in the second integration period.

The selection control signal SEL1 may be activated before the readout period, and the first through fourth pixel signals COL_1 through COL_4 corresponding to charges in which the first photoelectric charge Q1' and the second photoelectric charge Q2' have been added. A read out circuit (for example, 46 in FIG. 2) may obtain the ToF by using the first through fourth pixel signals COL_1 through COL4 in which both the first photoelectric charge Q1' and the second photoelectric charge Q2' have been reflected, and may obtain the distance information between the 3D object 26 and the plurality 201 of pixels 200.

The image sensor 24 according to the inventive concepts may use, in one frame, all of the first through fourth delay clock signals CLKa_1 through CLKa_4 output from the first delay circuit 120_1, and the first through fourth delay clock signals CLKb_1 through CLKb_4 output from the second delay circuit 120_2. Accordingly, the noise of the distance information that is generated as the phase delay times of the clock signals provided to the respective columns become different from each other may be decreased.

Figure 11A:
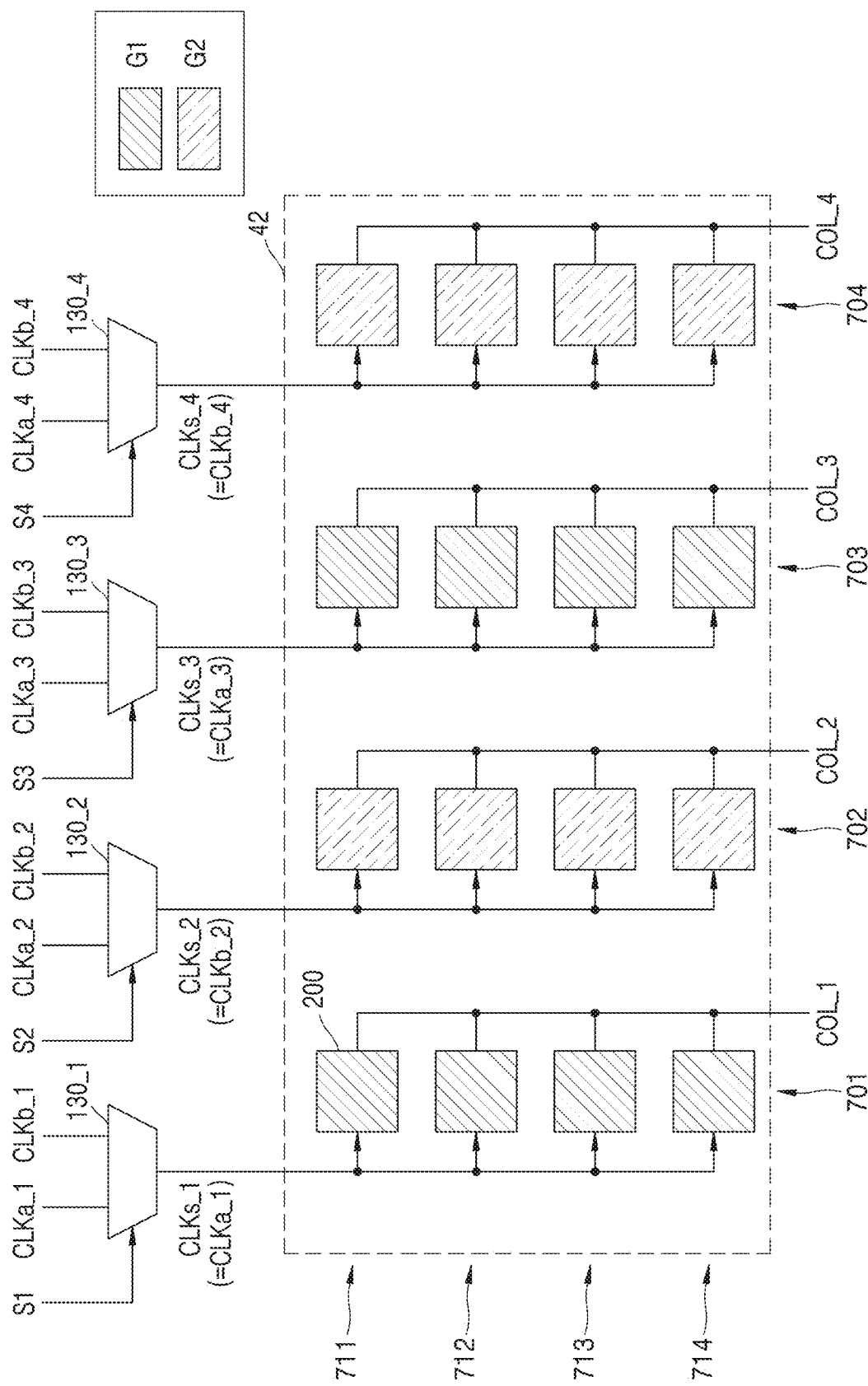
FIGS. 11A and 11B are diagrams for illustrating first photo gate signals provided in a pixel array of an image sensor, according to some example embodiments.
Figure 11B:
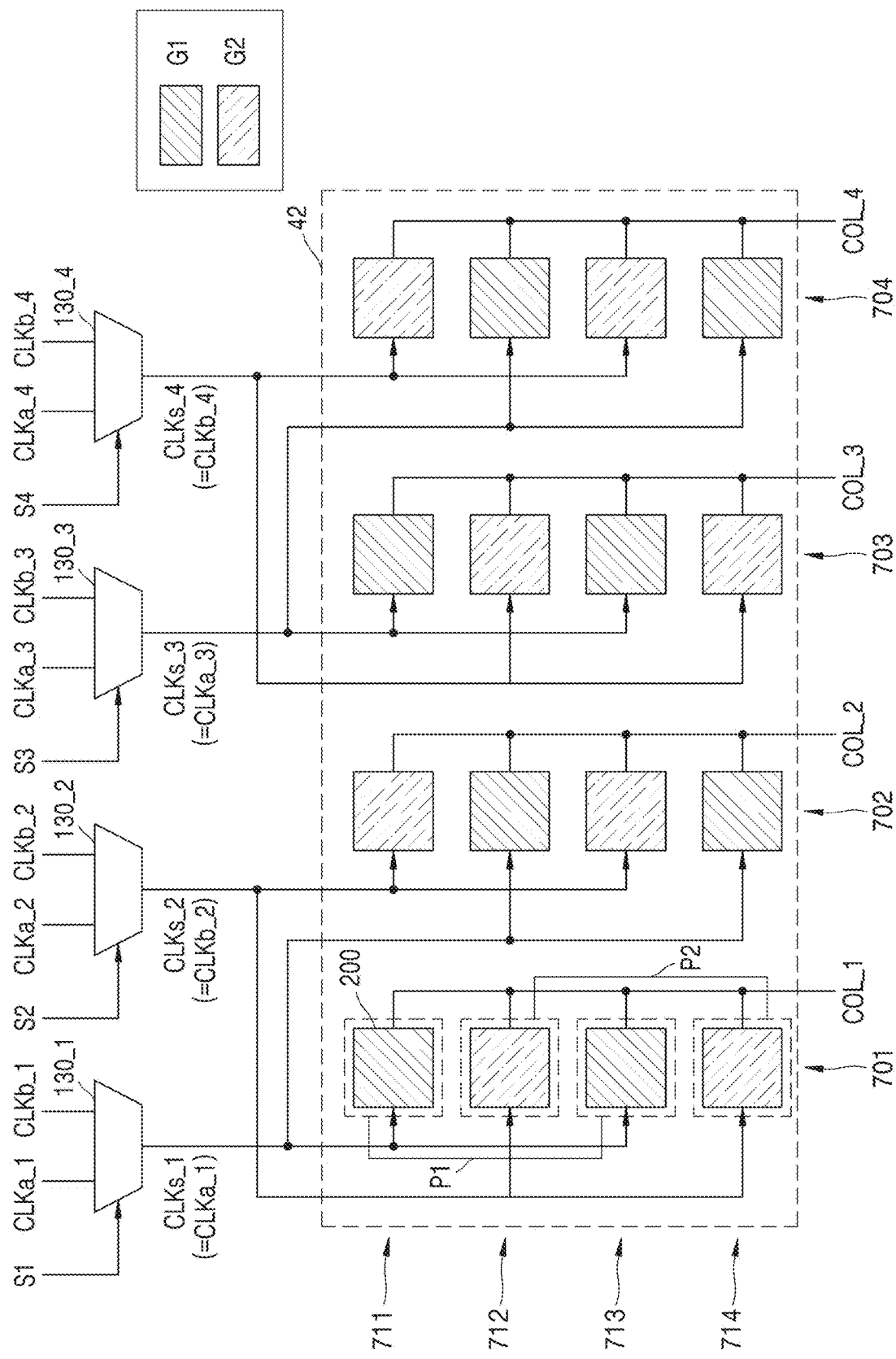

FIGS. 11A and 11B are diagrams for illustrating first photo gate signals provided in the pixel array 42 of the image sensor 24, according to some example embodiments. The photo gate signals of FIGS. 11A and 11B may be the first photo gate signal PGS1 in FIG. 3, but contents thereof may also be applied to the second photo gate signal PGS2. In FIGS. 11A and 11B, descriptions already given with reference to FIGS. 4A and 7 are omitted.

Referring to FIG. 11A, the pixel array 42 may be divided into two groups. In some example embodiments, the plurality 201 of pixels 200 may include a first group of pixels G1 and a second group of pixels G2. In some example embodiments, the pixels 200 included in the same column may comprise or constitute the same group. For example, the pixels 200 comprising or constituting odd-numbered columns may comprise or constitute a first group of pixels G1, and the pixels 200 comprising or constituting even-numbered columns may comprise or constitute a second group of pixels G2.

The first group of pixels G1 may be provided with at least one delay clock signal of the first through fourth delay clock signals CLKa_1 through CLKa_4 of the first delay clock signals 401 output from a first delay circuit (for example, 120_1 in FIG. 4A). Accordingly, pixels 200 of the first group of pixels G1 may be configured to receive one or more first delay clock signals of the first delay clock signals 401 as the photo gate signals received at the first group of pixels G1. For example, the pixels 200 comprising or constituting a first column of the first group of pixels G1 may be provided with the first delay clock signal CLKa_1 output from the first delay circuit 120_1, and the pixels 200 comprising or constituting a third column of the first group of pixels G1 may be provided with the third delay clock signal CLKa_3 output from the first delay circuit 120_1.

The second group of pixels G2 may be provided with at least one delay clock signal of the first through fourth delay clock signals CLKb_1 through CLKb_4 output from a second delay circuit (for example, 120_2 in FIG. 4A). Accordingly, pixels 200 of the second group of pixels G1 may be configured to receive one or more second delay clock signals of the second delay clock signals 402 as the photo gate signals received at the second group of pixels G2. For example, the pixels 200 comprising or constituting a second column of the second group of pixels G2 may be provided with the second delay clock signal CLKb_2 output from the second delay circuit 120_2, and the pixels 200 comprising or constituting a fourth column of the second group of pixels G2 may be provided with the fourth delay clock signal CLKb_4 output from the second delay circuit 120_2.

In some example embodiments, the plurality 201 of pixels 200 includes a first group of pixels G1 and a second group of pixels G2, each pixel 200 of the first group of pixels G1 is configured to receive a first delay clock signal (e.g., CLKa_1) and output a first pixel signal (e.g., COL_1) based on receiving the first delay clock signal, and each pixel 200 of the second group of pixels G2 is configured to receive a second delay clock signal (e.g., CLKb_1) and output a second pixel signal (e.g., COL_2) based on receiving the second delay clock signal.

A read out circuit (for example, 46 in FIG. 2) may obtain the distance information between the 3D object 26 and the plurality 201 of pixels 200 by interpolating the pixel signals output from the first group of pixels G1 and the pixel signals output from the second group of pixels G2. For example, the read out circuit 46 may interpolate the first pixel signal COL_1 and the second pixel signal COL_2 output from adjacent columns, and the third pixel signal COL_3 and the fourth pixel signal COL_4. Through the interpolation operation, the noise of the distance information that is generated as the phase delay times of the clock signals provided to the respective columns become different from each other may be decreased.

Referring to FIG. 11B, the pixel array 42 may be divided into two groups, in which pixels 200 comprising or constituting the same column may not necessarily form the same group. For example, as shown in FIG. 11B, some of the pixels 200 comprising or constituting the odd-numbered columns and some of the pixels 200 comprising or constituting the even-numbered columns may comprise or constitute one group. Accordingly, with reference to at least FIG. 11B, it will be understood that the first group of pixels G1 may include a first portion of pixels P1 of a given set of pixels 200 included in a given column (e.g., all of the pixels 200 in column 701), and the second group of pixels G2 may include s separate, second portion of pixels P2 of the given set of pixels 200 (e.g., all pixels 200 of column 701 that are not included in the first portion of pixels P1).

The first group of pixels G1 may be provided with at least one delay clock signal of the first through fourth delay clock signals CLKa_1 through CLKa_4 output from the first delay circuit 120_1. The second group of pixels G2 may be provided with at least one delay clock signal of the first through fourth delay clock signals CLKb_1 through CLKb_4 output from the second delay circuit 120_2.

The read out circuit 46 may obtain the distance information between the 3D object 26 and the plurality 201 of pixels 200 by interpolating the pixel signals output from the first group of pixels G1 and the pixel signals output from the second group of pixels G2. For example, the read out circuit 46 may interpolate the first pixel signal COL_1 and the second pixel signal COL_2, and the third pixel signal COL_3 and the fourth pixel signal COL_4. Through the interpolation operation, the noise of the distance information that is generated as the phase delay times of the clock signals provided to the respective columns become different from each other may be decreased.

Figure 12A:
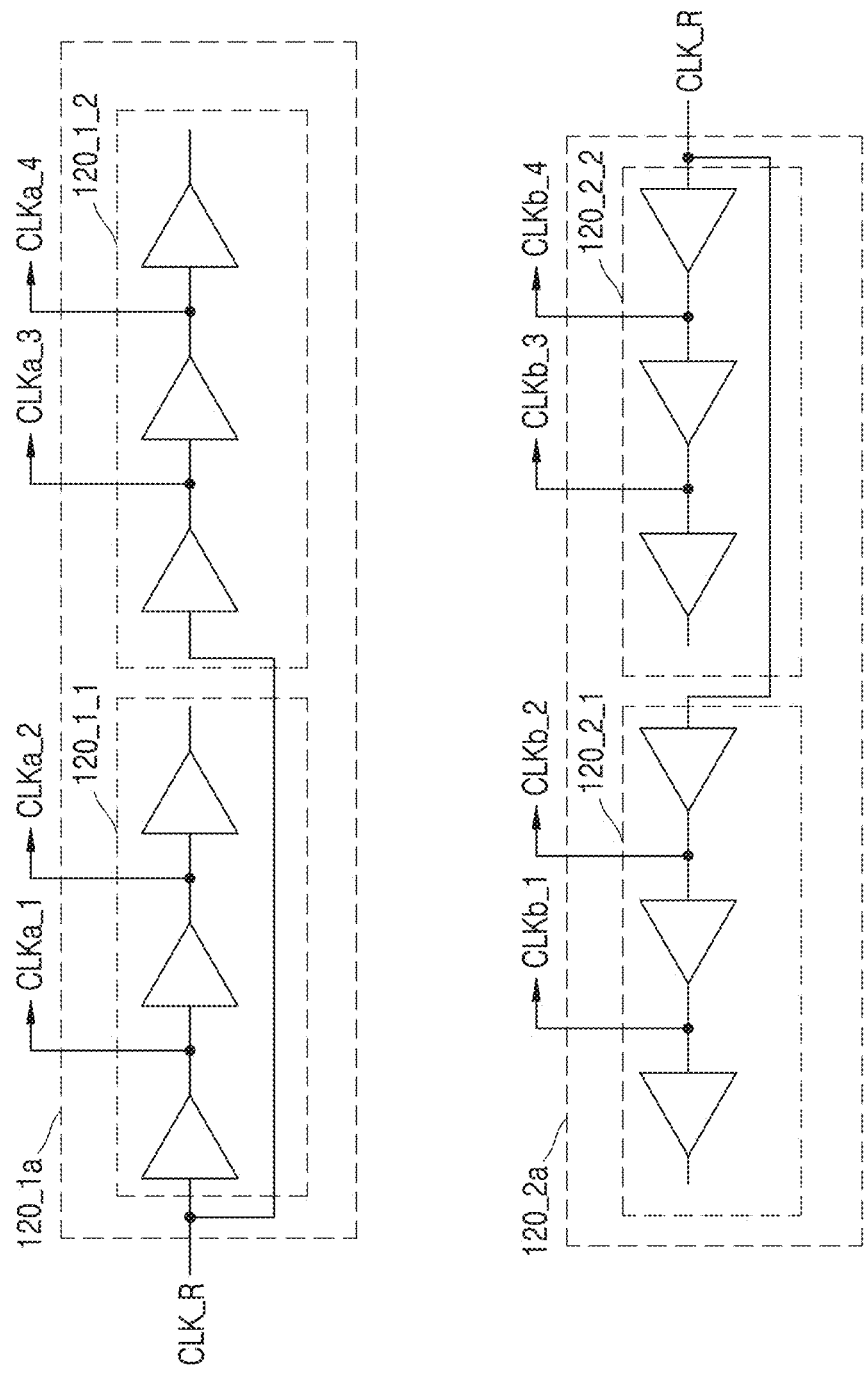
FIGS. 12A and 13A are circuit diagrams for explaining embodiments of the first delay circuit and the second delay circuit illustrated in FIGS. 4A and 4B, respectively, according to some example embodiments.
Figure 12B:
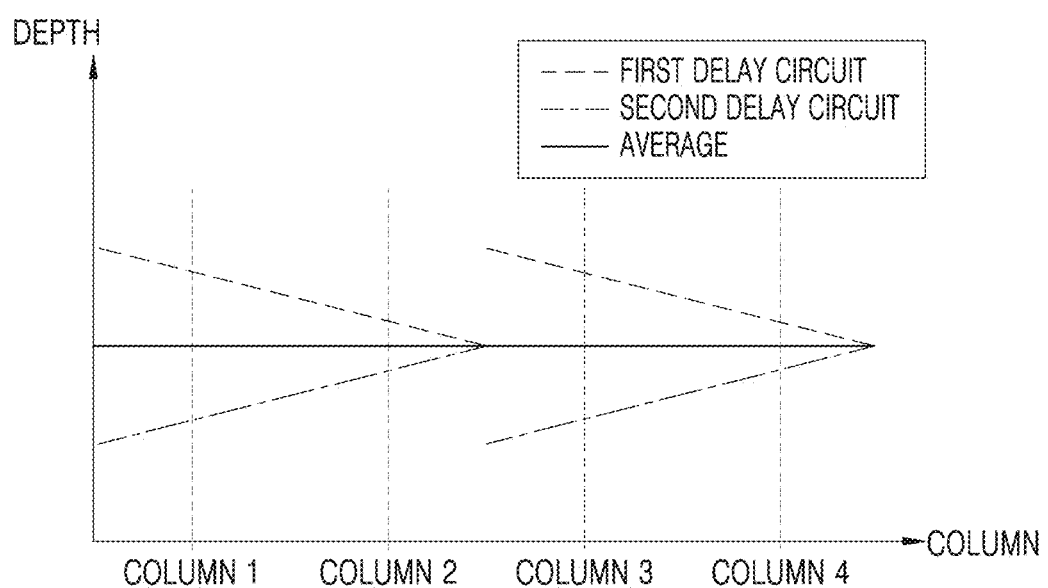
FIG. 12B is a graph illustrating depth information obtained according to photo gate signals provided to a pixel array from the first delay circuit and the second delay circuit illustrated in FIG. 12A, according to some example embodiments.
Figure 13A:
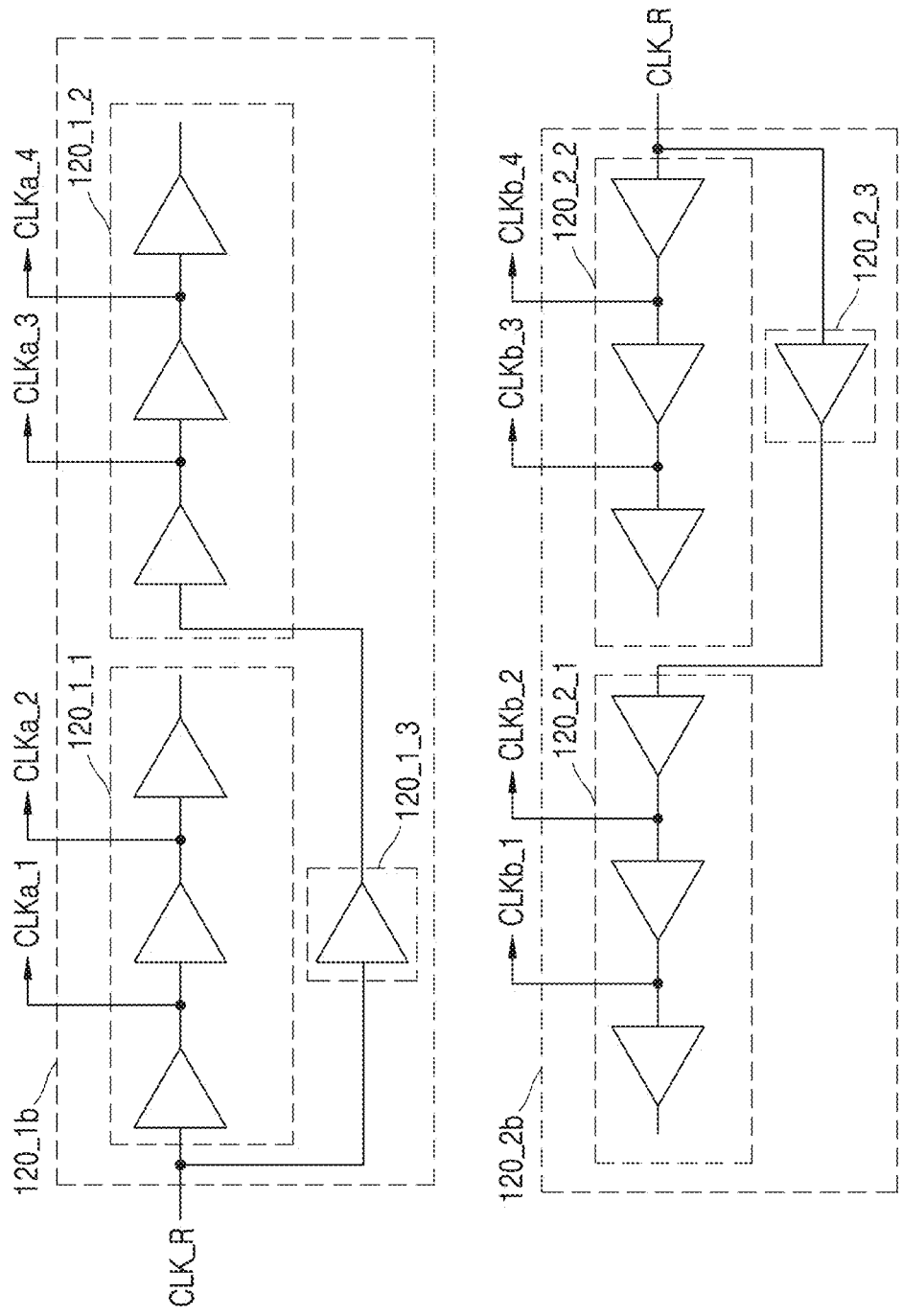
Figure 13B:
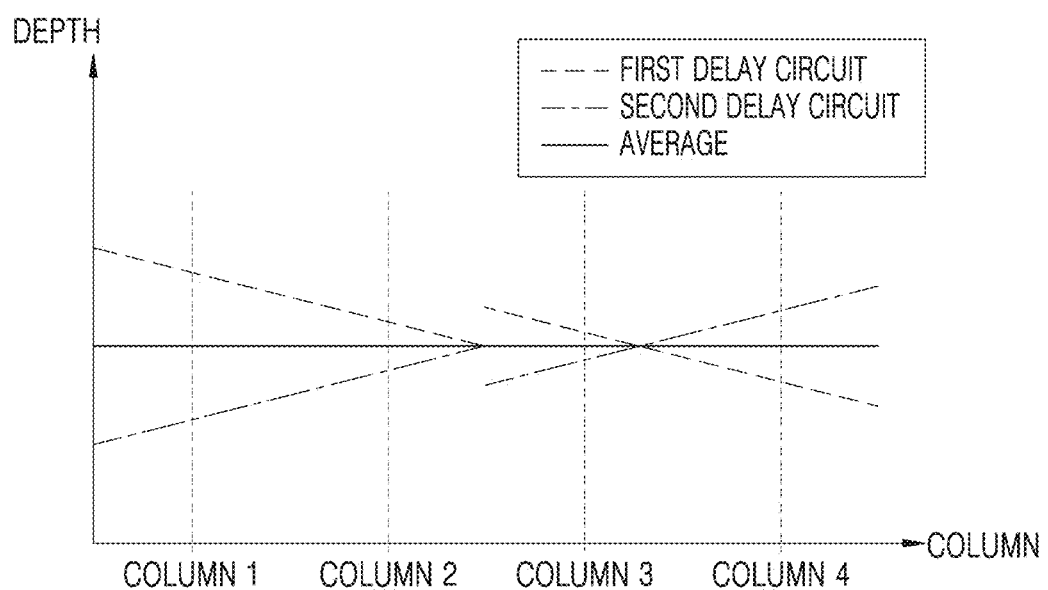
FIG. 13B is a graph illustrating depth information obtained according to photo gate signals provided to a pixel array from the first delay circuit and the second delay circuit illustrated in FIG. 12B, according to some example embodiments.

FIGS. 12A and 13A are circuit diagrams for explaining the first delay circuit 120_1 and the second delay circuit 120_2 illustrated in FIGS. 4A and 4B, respectively, according to some example embodiments. FIG. 12B is a graph illustrating depth information obtained according to photo gate signals provided to a pixel array from the first delay circuit 120_1a and the second delay circuit 120_2a illustrated in FIG. 12A, according to some example embodiments. FIG. 13B is a graph illustrating depth information obtained according to photo gate signals provided to a pixel array from the first delay circuit 120_1b and the second delay circuit 120_2b illustrated in FIG. 13A, according to some example embodiments.

Referring to FIGS. 7, 12A, and 12B, the first delay circuit 120_1a may include a first buffer chain 120_1_1 and a second buffer chain 120_1_2 each of which includes a plurality of buffers connected to each other in series. A first buffer chain 120_1_1 may output the first delay clock signal CLKa_1 and the second delay clock signal CLKa_2, and a second buffer chain 120_1_2 may output the third delay clock signal CLKa_3 and the fourth delay clock signal CLKa_4.

In some example embodiments, phases of at least two of the first through fourth delay clock signals CLKa_1 through CLKa_4 output from the first delay circuit 120_1a may be different from each other. For example, phases of the first delay clock signal CLKa_1 output from the first buffer chain 120_1_1, the second delay clock signal CLKa_2 output from the first buffer chain 120_1_1, or a combination thereof output from the first buffer chain 120_1_1, and the third delay clock signal CLKa_3 output from the second buffer chain 120_1_2, the fourth delay clock signal CLKa_4 output from the second buffer chain 120_1_2, or a combination thereof output from the second buffer chain 120_1_2 may be identical.

A second delay circuit 120_2a may include a first buffer chain 120_2_1 and a second buffer chain 120_2_2 each of which includes a plurality of buffers connected to each other in series. For example, the first buffer chain 120_1_1 may output the first delay clock signal CLKa_1 and the second delay clock signal CLKa_2, and the second buffer chain 120_1_2 may output the third delay clock signal CLKa_3 and the fourth delay clock signal CLKa_4.

In some example embodiments, phases of at least two of the first through fourth delay clock signals CLKa_1 through CLKa_4 output from the second delay circuit 120_2a may be different from each other. For example, phases of the first delay clock signal CLKb_1 output from the first buffer chain 120_2_1, the second delay clock signal CLKb_2 output from the first buffer chain 120_2_1, or any combination thereof output from the first buffer chain 120_2_1, and the third delay clock signal CLKb_3 output from the second buffer chain 120_2_2, the fourth delay clock signal CLKb_4 output from the second buffer chain 120_2_2, or any combination thereof output from the second buffer chain 120_2_2 may be identical.

Since each pixel 200 of the pixels 200 performs a sampling operation on the electrical signal generated by the reflected light beams (36 and 37) by using the first through fourth selected clock signals CLKs_1 through CLKs_4 provided as the first photo gate signal PGS1, the magnitudes of the output pixel signals COL_1 through COL_4 may vary as the phases of the first through fourth selection clock signals CLKs_1 through CLKs_4 are changed. For example, as the phase difference from the reference clock signal CLK_R increases, the distance may be measured as being closer.

The image sensor 24 according to the inventive concepts may selectively provide to the pixel array the first through fourth delay clock signals CLKa_1 through CLKa_4 output from the first delay circuit 120_1, and the first through fourth delay clock signals CLKb_1 through CLKb_4 output from the second delay circuit 120_2. The image sensor 24 may obtain the distance to the 3D object 26 by interpolating the pixel signals obtained by providing the first through fourth delay clock signals CLKa_1 through CLKa_4 output from the first delay circuit 120_1a, and the pixel signals obtained by providing the first through fourth delay clock signals CLKb_1 through CLKb_4. Accordingly, the noise of the distance information that is generated as the phase delay times of the photo gate signals provided to the respective pixels become different from each other may be decreased. Descriptions in FIGS. 9, 10, 11A, 11B may be applied to a method in which the first through fourth delay clock signals CLKa_1 to CLKa_4 output from the first delay circuit 120_1a and the first through fourth delay clock signals CLKb_1 through CLKb_4 output from the second delay circuit 120_2a are selectively selected and provided to the pixel array 42.

Referring to FIGS. 7, 13A, and 13B, the first delay circuit 120_1b may further include at least one buffer 120_1_3. Since the second buffer chain 120_1_2 of the first delay circuit 120_1b receives the reference clock signal CLK_R via the at least one buffer 120_1_3, the second buffer chain 120_1_2 may output the third and fourth delay clock signals CLKa_3 and CLKa_4 which are relatively delayed with respect to the first buffer chain 120_1_1.

The second delay circuit 120_2b may further include at least one buffer 120_2_3. Since the first buffer chain 120_2_1 of the second delay circuit 120_2b receives the reference clock signal CLK_R via the at least one buffer 120_2_3, the first buffer chain 120_2_1 may output the first and second delay clock signals CLKb_1 and CLKb_2 which are relatively delayed with respect to the second buffer chain 120_2_2. In FIG. 13A, the first delay circuit 120_1b and the second delay circuit 120_2b include the at least one buffers 120_1_3 and 120_2_3, respectively. However, the inventive concepts are not limited thereto, and each of the first delay circuit 120_1b and the second delay circuit 120_2b may further include a plurality of buffers, and may include, for example, a buffer tree.

Figure 14:
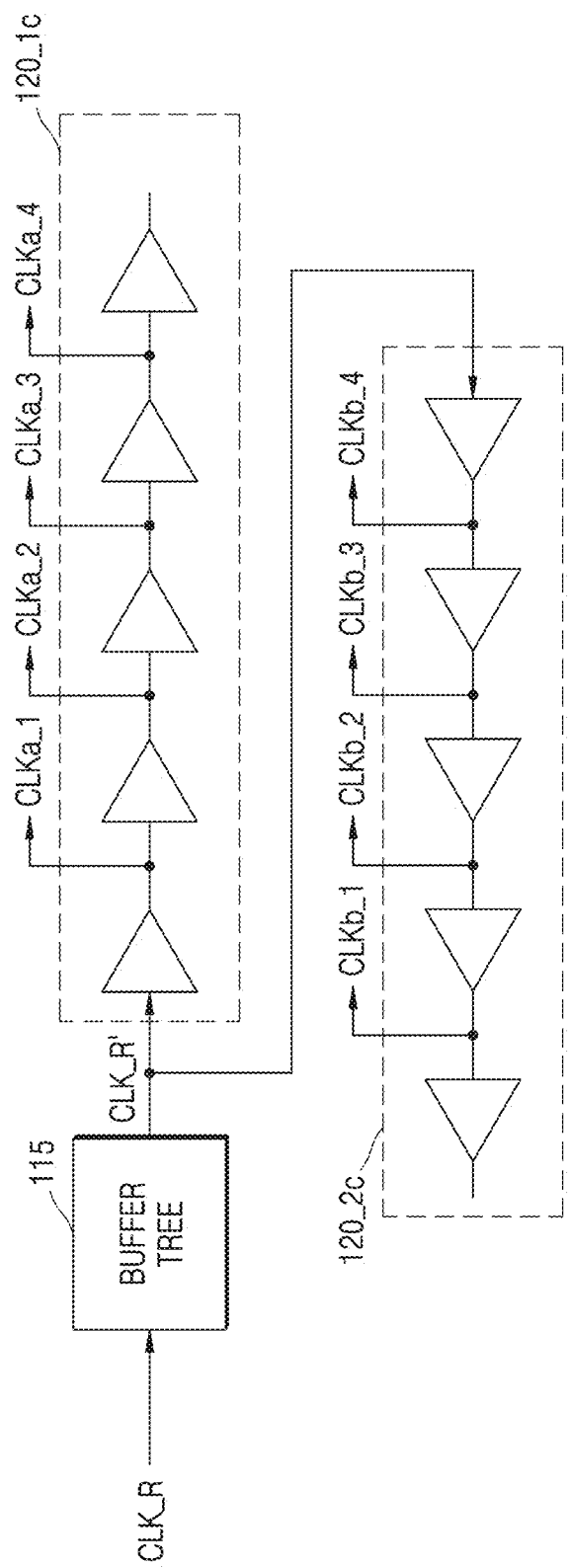
FIGS. 14 and 15 are diagrams for explaining structures of a photo gate controller, according to some example embodiments, respectively.
Figure 15:
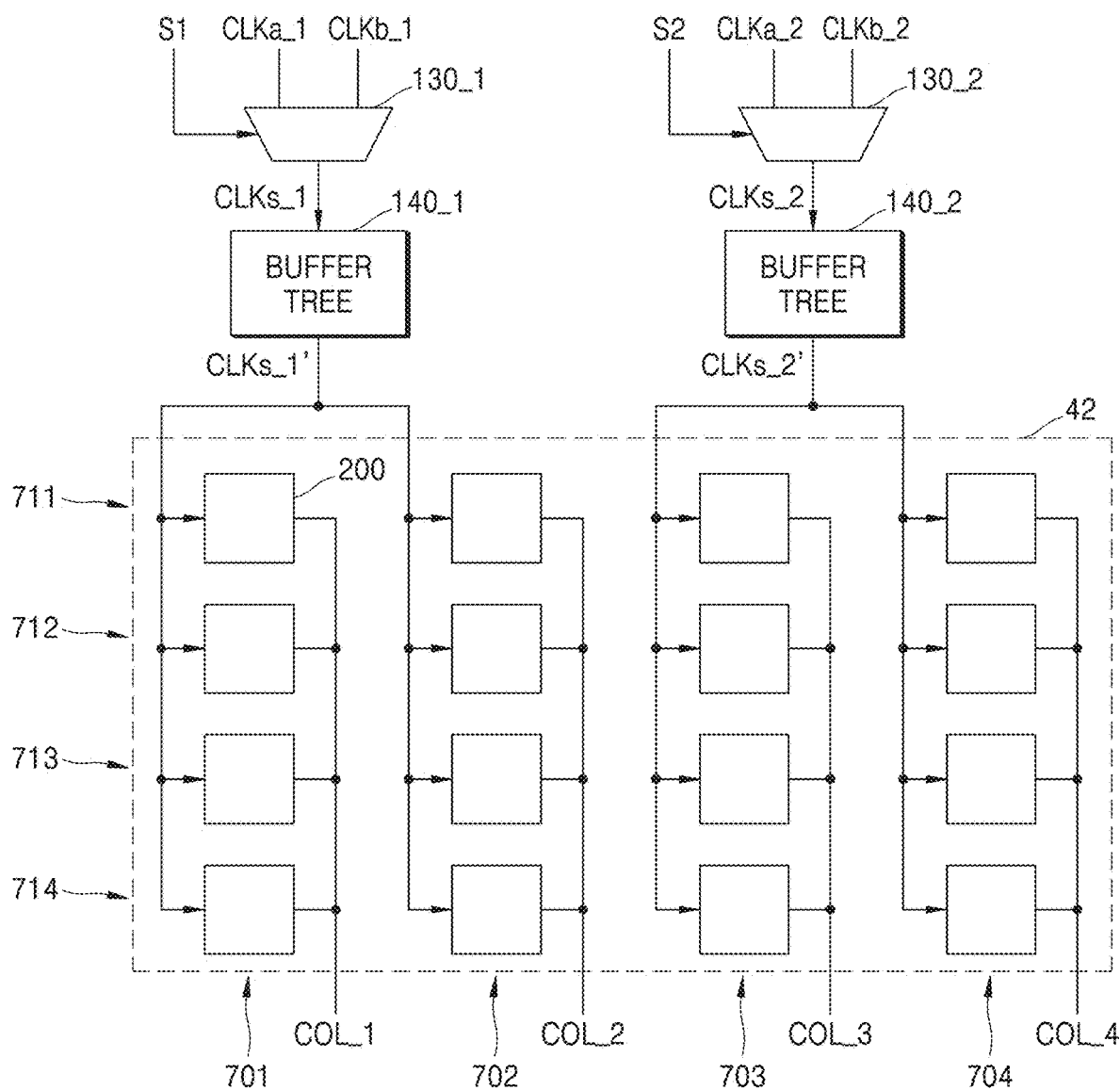

FIGS. 14 and 15 are diagrams for explaining structures of the photo gate controller 100, according to some example embodiments, respectively. In FIG. 14, descriptions already given with reference to FIG. 5 are omitted. In FIG. 15, descriptions already given with reference to FIG. 7 are omitted.

Referring to FIG. 14, the photo gate controller 100 may further include a buffer tree 115. The buffer tree 115 may receive the reference clock signal CLK_R from a reference clock signal generator (for example, 110 in FIG. 4A), and provide ("transmit") a delayed reference clock signal CLK_R' which is delayed by a certain time to a first delay circuit 120_1c and a second delay circuit 120_2c.

The buffer tree 115 may include the plurality of buffers. The delayed reference clock signal CLK_R' provided to the first delay circuit 120_1c and the delayed reference clock signal CLK_R' provided to the second delay circuit 120_2c may be delayed from the reference clock signal CLK_R by the identical certain time by passing through the same number of buffers.

Referring to FIG. 15, the photo gate controller 100 may further include a first buffer tree 140_1 and a second buffer tree 140_2. The first buffer tree 140_1 may receive the first selection clock signal CLKs_1 from the first selector 130_1, and may provide a first delayed selection clock signal CLKs_1' which is delayed from the first selection clock signal CLKs_1 by a first certain time, to each of the plurality of columns. In some example embodiments, the first buffer tree 140_1 may provide the first delayed selection clock signal CLKs_1' to adjacent columns, for example, the first column and the second column, such that pixels 200 included in separate columns of pixels are configured to receive, as separate, respective photo gate signals, signals delayed by identical certain amounts of time from the first selection clock signal CLKs_1 via the first buffer tree 140_1.

The second buffer tree 140_2 may receive the second selection clock signal CLKs_2 from the second selector 130_2, and may provide a second delayed selection clock signal CLKs_2' which is delayed from the second selection clock signal CLKs_2 by a second certain amount of time which may be the same as the first certain amount of time or different from the first certain amount of time, to each of the plurality of columns. For example, the second buffer tree 140_2 may provide the delayed second selection clock signal CLKs_2' to adjacent columns, for example, the third column and the fourth column.

The first selector 130_1 and the second selector 130_2 in FIG. 15 may operate in the same manner as the first selector 130_1 and the second selector 130_2, respectively, which are described in FIGS. 9, 10, 11A, and 11B. For example, the first selector 130_1 and the second selector 130_2 may receive, in the first frame, the first and second delay clock signals CLKa_1 and CLKa_2 output from the first delay circuit 120_1 as the first and second selection clock signals CLKs_1 and CLKs_2, respectively, and may select, in the second frame, the first and second delay clock signals CLKb_1 and CLKb_2 output from the second delay circuit 120_2 as the first and second selection clock signals CLKs_1 and CLKs_2, respectively. Alternatively, for example, the first selector 130_1 and the second selector 130_2 may select, in the first integration period, the first and second delay clock signals CLKa_1 and CLKa_2 output from the first delay circuit 120_1 as the first and second selection clock signals CLKs_1 and CLKs_2, respectively, and may select, in the second integration period, the first and second delay clock signals CLKb_1 and CLKb_2 output from the second delay circuit 120_2 as the first and second selection clock signals CLKs_1 and CLKs_2, respectively. Alternatively, for example, the first selector 130_1 may select the delay clock signal CLKa_1 output from the first delay circuit 120_1 as the first selection clock signal CLKs_1, and the second selector 130_2 may select the delay clock signal CLKb_2 output from the second delay circuit 120_2 as the second selection clock signal CLKs_2.

While the inventive concepts have been particularly shown and described with reference to example embodiments thereof, it will be understood that various changes in form and details may be made therein without departing from the spirit and scope of the following claims.

What is claimed is:
1. An image sensor, comprising:
a plurality of pixels, each pixel of the plurality of pixels configured to transmit a pixel signal in response to a photo gate signal received at one transmission transis- tor of the pixel in a frame, the pixel signal corresponding to a photoelectric signal generated at a photodiode of the pixel; and photo gate controller circuitry configured to generate a plurality of photo gate signals and transmit the plurality of photo gate signals to separate, respective sets of one or more pixels of the plurality of pixels, the photo gate controller circuitry including a first delay circuit configured to transmit first delay clock signals such that each first delay clock signal of the first delay clock signals is delayed with respect to a reference clock signal by a separate, respective particular first delay amount of time, and a second delay circuit configured to transmit second delay clock signals such that each second delay clock signal of the second delay clock signals is delayed with respect to the reference clock signal by a separate, respective particular second delay amount of time, wherein each pixel of the plurality of pixels is configured to selectively receive, as the photo gate signal received at the one transmission transistor of the pixel in the frame, one signal among a corresponding first delay signal of the first delay clock signals and a corresponding second delay signal of the second delay clock signals, according to a selection signal.

2. The image sensor of claim 1, wherein
the first delay circuit is configured to receive the reference clock signal, and
the second delay circuit is configured to receive one first delay clock signal of the first delay clock signals.

3. The image sensor of claim 1, wherein each delay circuit of the first delay circuit and the second delay circuit includes a separate plurality of buffers that are connected to each other in series.

4. The image sensor of claim 1, wherein each delay circuit of the first delay circuit and the second delay circuit includes a delay-locked loop (DLL).

5. The image sensor of claim 1, wherein
the plurality of pixels include an array of pixels, the array including a plurality of columns of pixels and a plurality of rows of pixels, each column of pixels including a separate set of pixels,
a set of pixels included in a same column of pixels, of the plurality of columns of pixels, are configured to receive identical photo gate signals,
each pixel of a first set of pixels included in a first column of pixels, of the plurality of columns of pixels, is configured to receive a selected first delay clock signal of the first delay clock signals as a photo gate signal received at the first set of pixels, and
each pixel of a second set of pixels included in a second column of pixels, of the plurality of columns of pixels, is configured to receive a selected second delay clock signal of the second delay clock signals as a photo gate signal received at the second set of pixels.

6. The image sensor of claim 5, wherein the first column of pixels and the second column of pixels are adjacent to each other.

7. The image sensor of claim 1, wherein,
the plurality of pixels are configured to receive one or more first delay clock signals of the first delay clock signals as photo gate signals received at the plurality of pixels in a first frame, and
the plurality of pixels are configured to receive one or more second delay clock signals of the second delay clock signals as photo gate signals received at the plurality of pixels in a second frame.

8. The image sensor of claim 1, wherein
the frame includes a first integration period and a second integration period, and each pixel of the plurality of pixels is configured to accumulate light charges corresponding to one or more photoelectric signals in response to one or more photo gate signals received at the pixel in the first integration period and the second integration period, and
each pixel of the plurality of pixels is configured to
receive one or more first delay clock signals of the first delay clock signals as a photo gate signal received at the pixel in the first integration period, and receive one or more second delay clock signals of the second delay clock signals as a photo gate signal received at the pixel in the second integration period.

9. The image sensor of claim 8, wherein a duration of the first integration period is identical to a duration of the second integration period.

10. The image sensor of claim 1, wherein
the plurality of pixels includes a first group of pixels and a second group of pixels,
pixels of the first group of pixels are configured to receive one or more first delay clock signals of the first delay clock signals as photo gate signals received at the first group of pixels, and
pixels of the second group of pixels are configured to receive one or more second delay clock signals of the second delay clock signals as photo gate signals received at the second group of pixels.

11. An image sensor, comprising:
a plurality of pixels, each pixel of the plurality of pixels configured to transmit a pixel signal in response to a photo gate signal received at the pixel in a frame, the pixel signal corresponding to a photoelectric signal generated at a photodiode of the pixel; and
photo gate controller circuitry configured to generate a plurality of photo gate signals and transmit the plurality of photo gate signals to separate, respective sets of one or more pixels of the plurality of pixels, the photo gate controller circuitry including a first delay circuit configured to transmit a first delay clock signal and a second delay clock signal, each delay clock signal of the first and second delay clock signals transmitted by the first delay circuit being delayed with respect to a reference clock signal by a separate, respective particular first delay amount of time, a second delay circuit configured to transmit a first delay clock signal and a second delay clock signal, each delay clock signal of the first and second delay clock signals transmitted by the second delay circuit being delayed with respect to the reference clock signal by a separate, respective second delay amount of time, a first selector configured to transmit, as one photo gate signal of the plurality of photo gate signals, a first selection clock signal selected between the first delay clock signal transmitted by the first delay circuit and the first delay clock signal transmitted by the second delay circuit, and a second selector configured to transmit, as a separate photo gate signal of the plurality of photo gate signals, a second selection clock signal selected between the second delay clock signal transmitted by the first delay circuit and the second delay clock signal transmitted by the second delay circuit, wherein the second delay clock signal transmitted by the first delay circuit has a longer delay time than the first delay clock signal transmitted by the first delay circuit, and the second delay clock signal transmitted by the second delay circuit has a shorter delay time than the first delay clock signal transmitted by the second delay circuit.

12. The image sensor of claim 11, wherein,
the first selector and the second selector are configured to select the first delay clock signal and the second delay clock signal transmitted by the first delay circuit, respectively, in a first frame, and
the first selector and the second selector select the first delay clock signal and the second delay clock signal transmitted by the second delay circuit, respectively, in a second frame that is subsequent to the first frame.

13. The image sensor of claim 11, wherein
the frame includes a first integration period and a second integration period, and each pixel of the plurality of pixels is configured to accumulate photoelectric charges corresponding to one or more photoelectric signals in response to one or more photo gate signals received at the pixel in the first integration period and the second integration period,
the first selector and the second selector are configured to select the first delay clock signal and the second delay clock signal transmitted by the first delay circuit, respectively, in the first integration period, and
the first selector and the second selector are configured to select the first delay clock signal and the second delay clock signal transmitted by the second delay circuit, respectively, in the second integration period.

14. The image sensor of claim 11, wherein the photo gate controller circuitry further includes a buffer tree configured to delay the reference clock signal by a certain amount of time to establish a delayed reference clock signal, and the buffer tree is configured to transmit the delayed reference clock signal to the first delay circuit and the second delay circuit.

15. The image sensor of claim 11, wherein the photo gate controller circuitry further includes
a first buffer tree configured to delay the first selection clock signal by a first certain amount of time, and
a second buffer tree configured to delay the second selection clock signal by a second certain amount of time.

16. The image sensor of claim 15, wherein
the plurality of pixels includes an array of pixels, the array including a plurality of columns of pixels and a plurality of rows of pixels, each column of pixels including a separate set of pixels, and
pixels included in separate columns of the plurality of columns of pixels are configured to receive, as separate, respective photo gate signals, signals delayed by identical certain amounts of time from the first selection clock signal via the first buffer tree.

17. An image sensor, comprising:
a plurality of pixels, each pixel of the plurality of pixels configured to transmit a pixel signal in response to a photo gate signal received at one transmission transistor of the pixel, the pixel signal corresponding to a photoelectric signal generated at a photodiode of the pixel;
photo gate controller circuitry configured to transmit photo gate signals to separate, respective sets of one or more pixels of the plurality of pixels, subsequently to generating the photo gate signals; and
a read out circuit configured to obtain depth information associated with an object based on some or all of the pixel signals transmitted by separate, respective pixels of the plurality of pixels,
wherein the photo gate controller circuitry includes
a first delay circuit configured to transmit a first delay clock signal delayed by a first particular amount of time with respect to a reference clock signal, and
a second delay circuit configured to transmit a second delay clock signal delayed by a second particular amount of time with respect to the reference clock signal,
wherein the photo gate controller circuitry is configured to select one signal among the first delay clock signal and the second delay clock signal as a selected signal according to a selection signal,
transmit the selected signal to each pixel of the plurality of pixels as the photo gate signal received at the one transmission transistor of the pixel, and
wherein the read out circuit is configured to obtain the depth information based on interpolating a first pixel signal transmitted by the some or all pixels in response to the first delay clock signal and a second pixel signal transmitted by the some or all pixels in response to the second delay clock signal.

18. The image sensor of claim 17, wherein,
each pixel of the plurality of pixels is configured to receive the first delay clock signal as the photo gate signal received at the one transmission transistor of the pixel and transmit the first pixel signal based on the photo gate signal received at the one transmission transistor of the pixel in a first frame, and
each pixel of the plurality of pixels is configured to receive the second delay clock signal as the photo gate signal received at the one transmission transistor of the pixel and transmit the second pixel signal based on the photo gate signal received at the one transmission transistor of the pixel in a second frame, the second frame subsequent to the first frame.

19. The image sensor of claim 17, wherein
the plurality of pixels includes a first group of pixels and a second group of pixels,
each pixel in the first group of pixels is configured to receive the first delay clock signal and output the first pixel signal based on receiving the first delay clock signal, and
each pixel in the second group of pixels is configured to receive the second delay clock signal and output the second pixel signal based on receiving the second delay clock signal.

20. The image sensor of claim 19, wherein pixels included in a same column of pixels among the plurality of pixels include a same group among the first group of pixels and the second group of pixels.

* * * * *